US010127985B2

(12) United States Patent
Yamaoka

(10) Patent No.: US 10,127,985 B2
(45) Date of Patent: Nov. 13, 2018

(54) SEMICONDUCTOR MEMORY DEVICE

(71) Applicant: Toshiba Memory Corporation, Tokyo (JP)

(72) Inventor: Masashi Yamaoka, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/881,662

(22) Filed: Jan. 26, 2018

(65) Prior Publication Data

US 2018/0254087 A1 Sep. 6, 2018

(30) Foreign Application Priority Data

Mar. 3, 2017 (JP) ................................ 2017-040437

(51) Int. Cl.

| | |
|---|---|
| ***G11C 11/34*** | (2006.01) |
| ***G11C 16/10*** | (2006.01) |
| ***G11C 16/30*** | (2006.01) |
| ***G11C 16/26*** | (2006.01) |
| ***G11C 16/04*** | (2006.01) |

(52) U.S. Cl.

CPC .......... *G11C 16/10* (2013.01); *G11C 16/0483* (2013.01); *G11C 16/26* (2013.01); *G11C 16/30* (2013.01)

(58) Field of Classification Search

CPC ......... G11C 16/10; G11C 16/30; G11C 16/12; G11C 16/0483; H01L 27/115

USPC ........................................ 365/185.18, 189.15

See application file for complete search history.

(56) References Cited

U.S. PATENT DOCUMENTS

| | | | | |
|---|---|---|---|---|
| 9,269,446 | B1 | 2/2016 | Magia et al. | |
| 2011/0244666 | A1 | 10/2011 | Kim et al. | |
| 2013/0130468 | A1 | 5/2013 | Higashitani et al. | |
| 2014/0050031 | A1* | 2/2014 | Shikata | H01L 29/78 365/185.25 |
| 2014/0226402 | A1 | 8/2014 | Duzly et al. | |
| 2015/0054046 | A1 | 2/2015 | Higashitani et al. | |

OTHER PUBLICATIONS

Office Action dated Feb. 27, 2018 in corresponding Taiwanese Patent Application No. 106124252 with English translation, 11 pages.

* cited by examiner

*Primary Examiner* — Son Dinh

(74) *Attorney, Agent, or Firm* — Patterson & Sheridan, LLP

(57) ABSTRACT

A semiconductor memory device includes first and second memory cells, first and second word lines that are connected to the first and second memory cells, respectively, a first transistor connected to one end of the first word line, and second and third transistors respectively connected to first and second ends of the second word line. During a read operation on the first and second memory cells, when the first word line is selected, a first voltage is applied to the second word line, and then a second voltage is applied to the first word line, and when the second word line is selected, the first voltage is applied to the first word line, and then the second voltage is applied to the second word line. The second voltage is applied to the first word line for a longer duration than is applied to the second word line.

20 Claims, 23 Drawing Sheets

| PAGE | DATA | | | |
|---|---|---|---|---|
| Upper | 0 | 1 | 1 | 0 |
| Lower | 1 | 1 | 0 | 0 |

SEMICONDUCTOR MEMORY DEVICE

CROSS-REFERENCE TO RELATED APPLICATION

This application is based upon and claims the benefit of priority from Japanese Patent Application No. 2017-040437, filed Mar. 3, 2017, the entire contents of which are incorporated herein by reference.

FIELD

Embodiments described herein relate generally to a semiconductor memory device.

BACKGROUND

A NAND type flash memory in which memory cells are three-dimensionally stacked is known.

DETAILED DESCRIPTION

Embodiments provide a semiconductor memory device capable of operating at high speed.

In general, according to one embodiment, the semiconductor memory device includes first and second memory cells, first and second word lines that are connected to the first and second memory cells, respectively, a first transistor connected to one end of the first word line, a second transistor connected to a first end of the second word line, and a third transistor connected to a second end of the second word line. During a read operation performed on the first and second memory cells, when the first word line is selected, a first voltage is applied to the second word line by turning on the second and third transistors, and then a second voltage is applied to the first word line by turning on the first transistor, and when the second word line is selected, the first voltage is applied to the first word line by turning on the first transistor, and then the second voltage is applied to the second word line by turning on the second and third transistors. The first transistor is turned on for a first time period to apply the second voltage to the first word line when the first word line is selected, and the second and third transistors are turned on for a second time period, which is shorter than the first time period, to apply the second voltage to the second word line when the second word line is selected.

Hereinafter, exemplary embodiments of the present disclosure will be described with reference to the accompanying drawings. The drawings are schematic. Further, in the following description, the same symbols are given to elements having substantially the same functions and configurations. The numbers after the letters constituting reference symbols and the letters after the numbers constituting the reference symbols are used to distinguish between elements having substantially the same functions and configurations. When there is no need to distinguish between elements represented by reference symbols including the same letters and numbers, these elements are referred to only by reference symbols including the same letters and numbers.

[1] First Exemplary Embodiment

Hereinafter, a semiconductor memory device according to a first exemplary embodiment will be described.

[1-1] Configuration

[1-1-1] Overall Configuration of Semiconductor Memory Device 10

Figure 1:
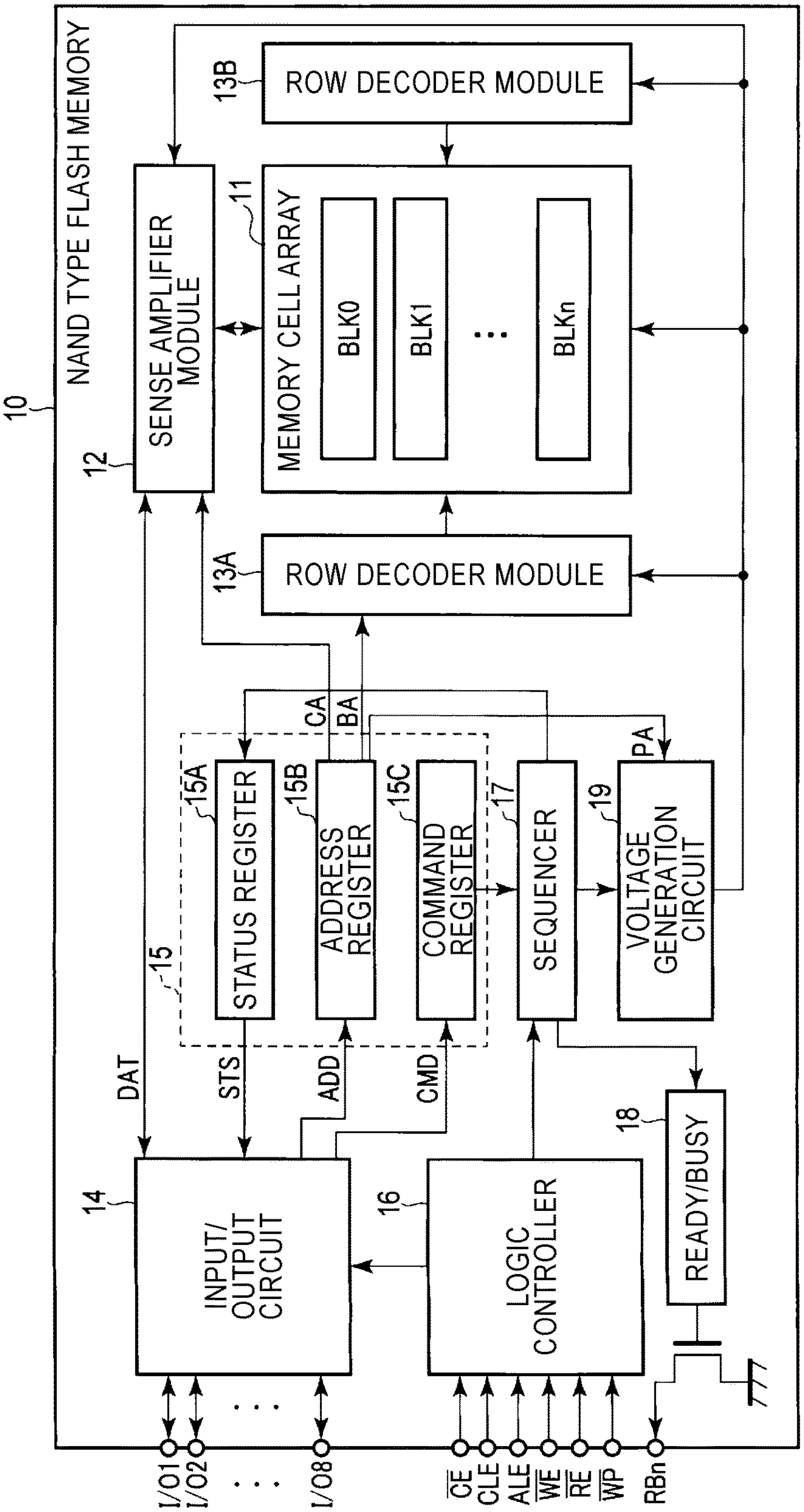
FIG. 1 is a block diagram illustrating a semiconductor memory device according to a first exemplary embodiment.

First, the overall configuration of a semiconductor memory device 10 will be described with reference to FIG. 1. FIG. 1 illustrates a block diagram of the semiconductor memory device 10. As illustrated in FIG. 1, the semiconductor memory device 10 includes a memory cell array 11, a sense amplifier module 12, row decoder modules 13A and 13B, an input/output circuit 14, registers 15, a logic controller 16, a sequencer 17, a ready/busy control circuit 18, and a voltage generation circuit 19.

The memory cell array 11 includes blocks BLK0 to BLKn (n is a natural number of 1 or more). A block BLK is a set of a plurality of nonvolatile memory cells associated with bit lines and word lines, and is, for example, a unit of erasing data. The semiconductor memory device 10 may store data of 2 bits or more in each memory cell by applying, for example, a multi-level cell (MLC) method.

The sense amplifier module 12 outputs data DAT read from the memory cell array 11 to an external memory controller via the input/output circuit 14. Further, the sense amplifier module 12 transmits write data DAT received from the memory controller via the input/output circuit 14 to the memory cell array 11.

The row decoder module 13 selects the block BLK to perform various operations based on a block address BA held in an address register 15B. Also, the row decoder module 13 transmits the voltage supplied from the voltage generation circuit 19 to the selected block BLK. For example, the row decoder module 13A applies a voltage from one end of the word line, and the row decoder module 13B applies a voltage from the other end of the word line.

The input/output circuit 14 transmits/receives, for example, an input/output signal I/O (I/O1 to I/O8) having an 8-bit width to/from the memory controller. For example, the input/output circuit 14 transmits the write data DAT included in the input/output signal I/O received from the memory controller to the sense amplifier module 12. Further, the input/output circuit 14 transmits the read data DAT transmitted from the sense amplifier module 12 to the memory controller as the input/output signal I/O.

The registers 15 include a status register 15A, an address register 15B, and a command register 15C. The status register 15A holds, for example, status information STS of the sequencer 17. The address register 15B holds address information ADD transmitted from the input/output circuit 14. A column address CA, a block address BA, and a page address PA included in the address information ADD are used in the sense amplifier module 12, the row decoder module 13, and the voltage generation circuit 19, respectively. The command register 15C holds a command CMD transmitted from the input/output circuit 14.

The logic controller 16 controls the input/output circuit 14 and the sequencer 17 based on various control signals received from the memory controller. These control signals include, for example, a chip enable signal /CE, a command latch enable signal CLE, an address latch enable signal ALE, a write enable signal /WE, a read enable signal /RE, and a write protection signal /WP. The signal /CE is a signal for enabling the semiconductor memory device 10. The signal /CLE is a signal for notifying the input/output circuit 14 that the signal input to the input/output circuit 14 in parallel with the asserted signal CLE is the command CMD. The signal ALE is a signal for notifying the input/output circuit 14 that the signal input to the input/output circuit 14 in parallel with the asserted signal ALE is the address information ADD. The signal /WE and the signal /RE are signals for instructing the input/output circuit 14, for example, to use the input/output signal I/O for input and output, respectively. The signal /WP is a signal for putting the semiconductor memory device 10 into a protection state, for example, when the power is turned on/off.

The sequencer 17 controls the overall operation of the semiconductor memory device 10 based on the command CMD held in the command register 15C. Specifically, the sequencer 17 executes various operations such as a write operation or a read operation by controlling, for example, the sense amplifier module 12, the row decoder module 13, and the voltage generation circuit 19.

The ready/busy control circuit 18 generates a ready/busy signal RBn based on the operation state of the sequencer 17. The signal RBn is a signal for notifying the memory controller whether the semiconductor memory device 10 is in a ready state in which it is capable of receiving instructions from the memory controller or in a busy state in which it is not capable of receiving instructions from the memory controller.

The voltage generation circuit 19 generates a desired voltage based on the control of the sequencer 17 and supplies the generated voltage to the memory cell array 11, the sense amplifier module 12, the row decoder module 13, and the like. For example, the voltage generation circuit 19 applies a desired voltage to a signal line corresponding to a selected word line and a signal line corresponding to a non-selected word line, respectively, based on the page address PA held in the address register 15B.

[1-1-2] Configuration of Memory Cell Array 11

Figure 2:
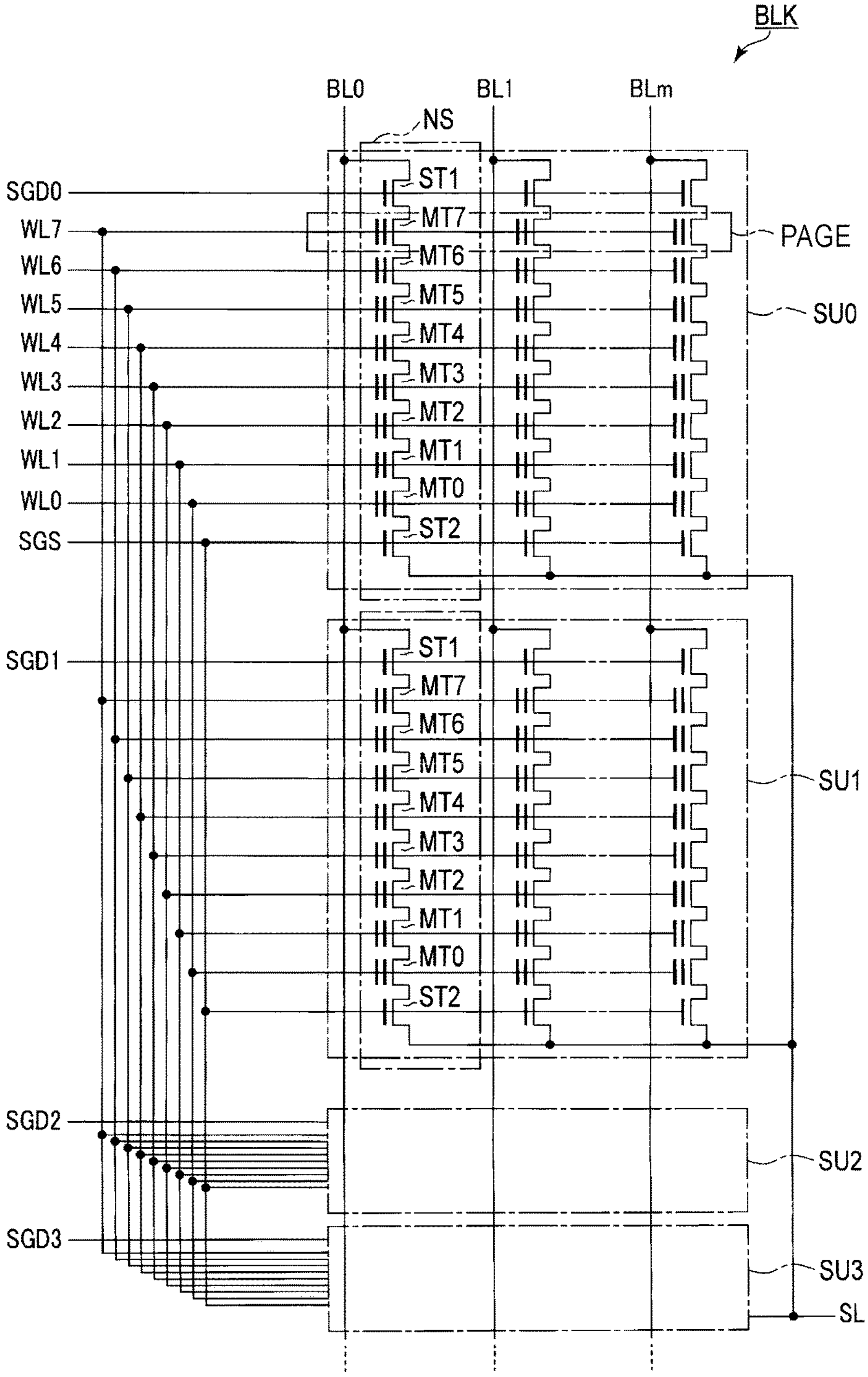
FIG. 2 is a circuit diagram of a memory cell array provided in the semiconductor memory device according to the first exemplary embodiment.

Next, descriptions will be made on a circuit configuration of the memory cell array 11 with reference to FIG. 2. FIG. 2 is a circuit diagram of the memory cell array and illustrates a detailed circuit configuration regarding one block BLK in the memory cell array 11. As illustrated in FIG. 2, the block BLK includes, for example, string units SU0 to SU3. Further, the number of string units SU provided in the block BLK is not limited thereto, and the block BLK may be configured to have any number of string units SU.

Each of string units SU includes a plurality of NAND strings NS. The plurality of NAND strings NS provided in each string unit SU are provided to correspond to bit lines BL0 to BLm (m is a natural number of 1 or more), respectively. Each of the NAND strings NS includes, for example, eight memory cell transistors MT (MT0 to MT7) and select transistors ST1 and ST2. Further, the number of the memory cell transistors MT provided in the NAND strings NS is not limited to eight and any number of the memory cell transistors MT may be provided for each NAND string NS.

The memory cell transistors MT include a control gate and a charge storage layer, and holds data in a nonvolatile manner. The memory cell transistors MT0 to MT7 are connected in series between the source of the select transistor ST1 and the drain of the select transistor ST2. Control gates of the memory cell transistors MT0 to MT7 within the same block BLK are commonly connected to word lines WL0 to WL7, respectively.

The gates of the select transistor ST1 in the string units SU0 to SU3 are commonly connected to select gate lines SGD0 to SGD3, respectively. The drain of the select transistor ST1 in the same column of the same block BLK is commonly connected to the bit line BL corresponding thereto, and the drain of the select transistor ST1 in the same column is commonly connected across a plurality of blocks BLK to the bit line BL corresponding thereto. The gate of the select transistor ST2 in the same block is commonly connected to select gate line SGS. The source of the select transistor ST2 in the same block is commonly connected to a source line SL. Further, the source of the select transistor ST2 is commonly connected across a plurality of blocks BLK to the source line SL.

In the following description, a set of one-bit data held by a plurality of memory cell transistors MT of one string unit SU connected to a common word line WL is referred to as "page." Therefore, when two-bit data is stored in one memory cell transistor MT, two-page data is stored in the set of the plurality of memory cell transistors MT of one string unit SU connected to one word line WL.

Figure 3:
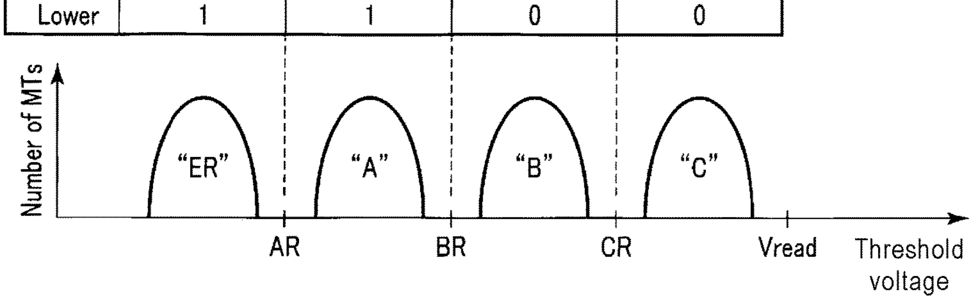
FIG. 3 is a view for explaining a threshold voltage distribution and data allocation of memory cells provided in the semiconductor memory device according to the first exemplary embodiment.

Further, the threshold voltage distribution of the memory cell transistor MT is illustrated, for example, in FIG. 3. FIG. 3 illustrates the threshold voltage distribution of the memory cell transistor MT when the MLC method is applied, the allocated data, and the voltage used in the read operation. The vertical and horizontal axes in FIG. 3 correspond to the number of memory cell transistors MT and threshold voltage of the memory cell transistors MT, respectively.

As illustrated in FIG. 3, when the MLC method is applied, the threshold voltage distribution of the memory cell transistor MT is divided into four. These four threshold voltage distributions are referred to as "ER" level, "A" level, "B" level, and "C" level in ascending order of the threshold voltage. The "ER" level is an erase state of the memory cell transistor MT, and "A" level, "B" level, and "C" level are write states of the memory cell transistor MT.

Two-bit data is allocated to each of these threshold voltage distributions. Specifically, for example, "01" ("upper bit/lower bit") data, "11" data, "01" data, and "00" data are allocated respectively to the threshold voltage distributions of the "ER" level, "A" level, "B" level, and "C" level.

Also, each of the read voltages used in the read operation is set between adjacent threshold voltage distributions. Specifically, the read voltage AR for determining whether the threshold voltage of a certain memory cell transistor MT is at the "ER" level or at the "A" level or higher is set between the maximum threshold voltage at the "ER" level and the minimum threshold voltage at the "A" level. The read voltage BR for determining whether a certain memory cell transistor MT is at the "A" level or lower or at the "B" level or higher is set between the maximum threshold voltage at the "A" level and the minimum threshold voltage at the "B" level. The read voltage CR is also set in the same manner as the read voltages AR and BR. Further, a read pass voltage Vread, which is a voltage applied to a non-selected word line during the read operation, is set to a voltage higher than the maximum threshold voltage in the threshold voltage distribution at the "C" level. That is, the memory cell transistor MT in which the voltage Vread is applied to the control gate is turned on regardless of data held therein.

When the above-described allocation of data is applied, lower page data is determined by a read result using the voltage BR, and upper page data is determined by a read result using the voltages AR and CR. That is, the lower page data is determined by one read, and the upper page data is determined by two reads.

[1-1-3] Configuration of Sense Amplifier Module 12

Figure 4:
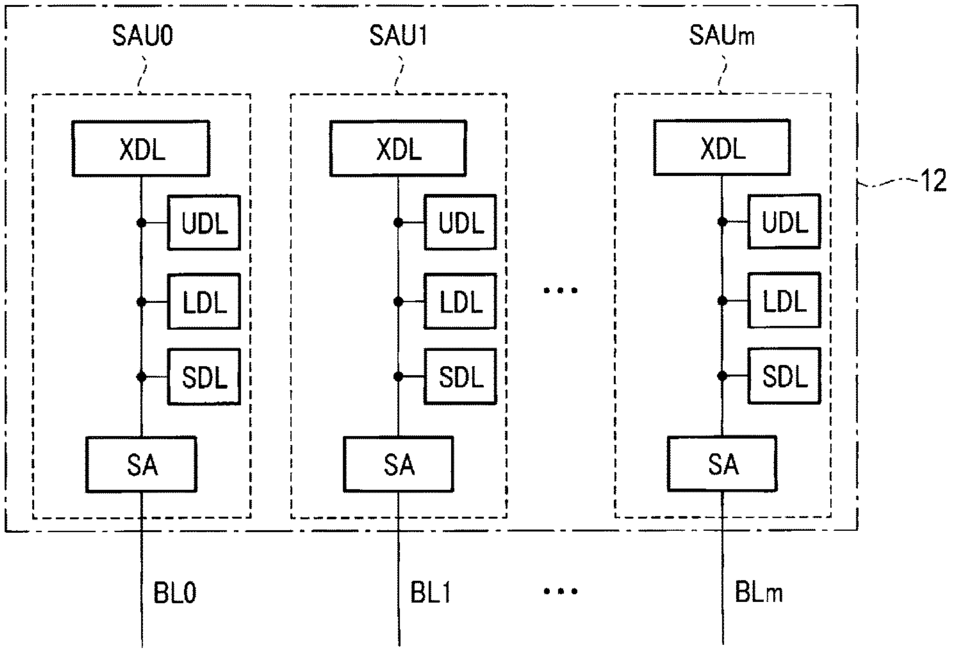
FIG. 4 is a block diagram of a sense amplifier module provided in the semiconductor memory device according to the first exemplary embodiment.
Figure 5:
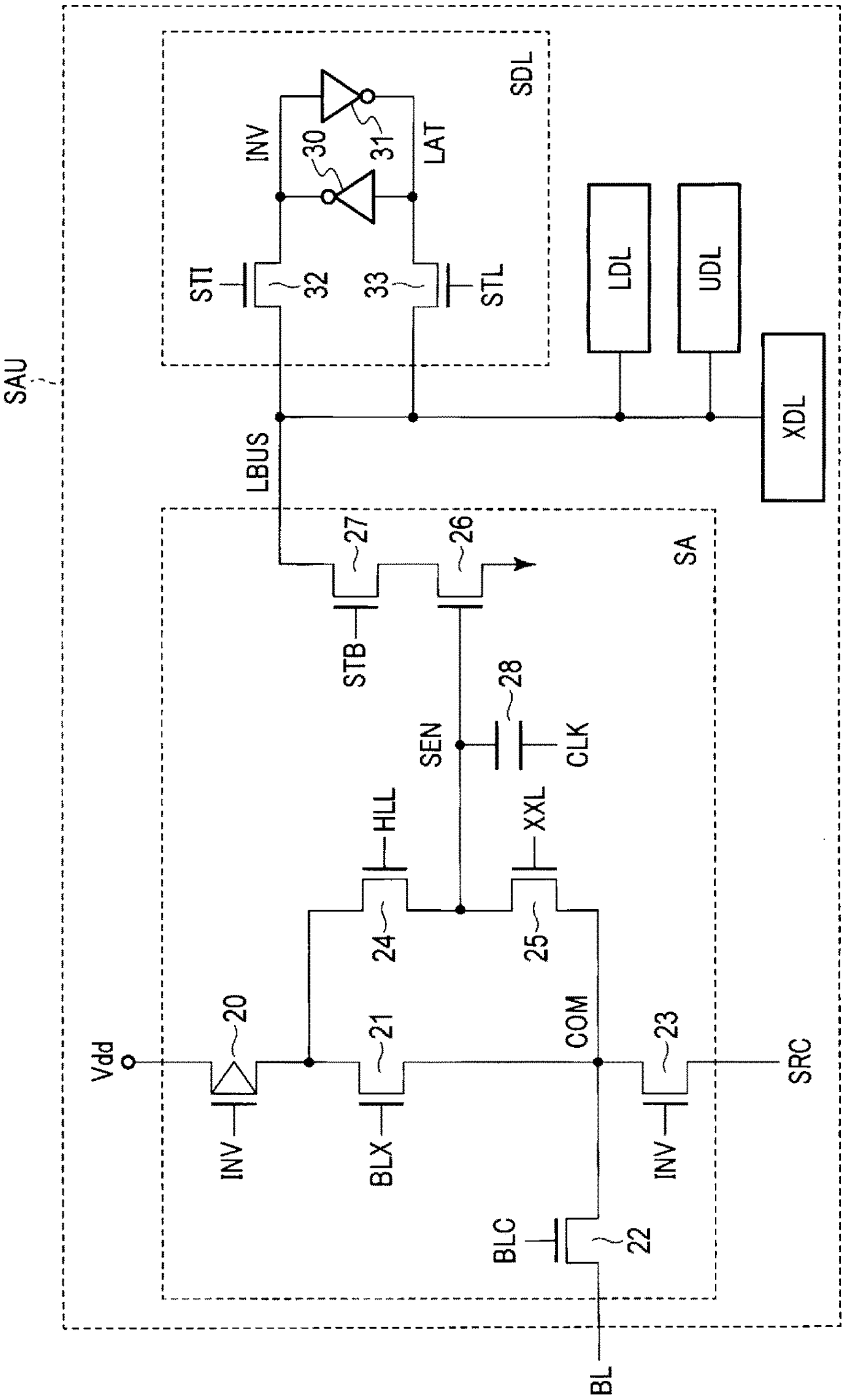
FIG. 5 is a circuit diagram of the sense amplifier module provided in the semiconductor memory device according to the first exemplary embodiment.

Next, descriptions will be made on the configuration of the sense amplifier module 12 with reference to FIGS. 4 and 5. FIG. 4 illustrates a block diagram of the sense amplifier module 12 and FIG. 5 illustrates a detailed circuit configuration of the sense amplifier module 12. As illustrated in FIG. 4, the sense amplifier module 12 includes sense amplifier units SAU0 to SAUm.

The sense amplifier units SAU0 to SAUm are provided to correspond to the bit lines BL0 to BLm, respectively. Each sense amplifier unit SAU includes a sense amplifier SA, and latch circuits SDL, LDL, UDL, and XDL. In each sense amplifier unit SAU, the sense amplifier SA, the latch circuits SDL, LDL, UDL, and XDL are connected so that data can be sent to and received from each other.

During the read operation, the sense amplifier SA senses the data read in the corresponding bit line BL and determines whether the read data is "0" or "1," and during the write operation, the sense amplifier SA applies a voltage to the corresponding bit line BL based on the write data. As illustrated in FIG. 5, the sense amplifier SA includes a p-channel MOS transistor 20, n-channel MOS transistors 21 to 27, and a capacitor 28.

One end of the transistor 20 is connected to the power supply line and the gate of the transistor 20 is connected to a node INV. One end of the transistor 21 is connected to the other end of the transistor 20, the other end of the transistor 21 is connected to a node COM, and a control signal BLX is input to the gate of the transistor 21. One end of the transistor 22 is connected to the node COM, the other end of the transistor 22 is connected to the corresponding bit line BL, and a control signal BLC is input to the gate of the transistor 22. One end of the transistor 23 is connected to the node COM, the other end of the transistor 23 is connected to a node SRC, and the gate of the transistor 23 is connected to a node INV. One end of the transistor 24 is connected to the other end of the transistor 20, the other end of the transistor 24 is connected to a node SEN, and a control signal HLL is input to the gate of the transistor 24. One end of the transistor 25 is connected to a node SEN, the other end of the transistor 25 is connected to the node COM, and a control signal XXL is input to the gate of the transistor 25. One end of the transistor 26 is grounded and the gate of the transistor 26 is connected to the node SEN. One end of the transistor 27 is connected to the other end of the transistor 26, the other end of the transistor 27 is connected to a bus LBUS, and a control signal STB is input to the gate of the transistor 27. One end of the capacitor 28 is connected to the node SEN and a clock CLK is input to the other end of the capacitor 28.

The latch circuits SDL, LDL, and UDL temporarily hold read data and write data. As illustrated in FIG. 5, the latch circuit SDL includes inverters 30 and 31 and n-channel MOS transistors 32 and 33.

An input terminal of the inverter 30 is connected to a node LAT, and an output terminal of the inverter 30 is connected to a node INV. An input terminal of the inverter 31 is connected to the node INV, and an output terminal of the inverter 31 is connected to the node LAT. One end of the transistor 32 is connected to the node INV, the other end of the transistor 32 is connected to a bus LBUS, and a control signal STI is input to the gate of the transistor 32. One end of the transistor 33 is connected to the node LAT, the other end of the transistor 33 is connected to the bus LBUS, and a control signal STL is input to the gate of the transistor 33. Further, since the circuit configuration of the latch circuits LDL and UDL is the same as the above-described circuit configuration of the latch circuit SDL, the descriptions thereof will be omitted.

The latch circuit XDL is used for inputting/outputting data between the sense amplifier unit SAU and the input/output circuit 14. For example, the write data received from the input/output circuit 14 is transmitted to the latch circuit SDL, LDL, or UDL via the latch circuit XDL, and the data read from the memory cell transistor MT is transmitted to the input/output circuit 14 via the latch circuit XDL.

In the above-described configuration of the sense amplifier unit SAU, for example, a voltage Vdd, which is the power supply voltage of the semiconductor memory device 10, is applied to the power supply line connected to one end of the transistor 20, and for example, a voltage Vss, which is the ground voltage of the semiconductor memory device 10, is applied to the node SRC. Further, the above-described various control signals are generated, for example, by the sequencer 17. For example, when the sequencer 17 asserts the signal STB in the read operation, the sense amplifier unit SAU determines the read data based on the voltage of the node SEN.

In addition, the above-described configuration of the sense amplifier unit 12 is not limited thereto. For example, the number of the latch circuits provided in the sense amplifier unit SAU may be changed based on the number of bits of data held by one memory cell transistor MT.

Further, in the foregoing description, a case where the sense amplifier units SAU and the bit line BLs are provided in one-to-one correspondence has been described as an example, but the present disclosure is not limited thereto. For example, a plurality of bit lines BL may be connected to one sense amplifier unit SAU via a selector.

[1-1-4] Configuration of Row Decoder Module 13

Figure 6:
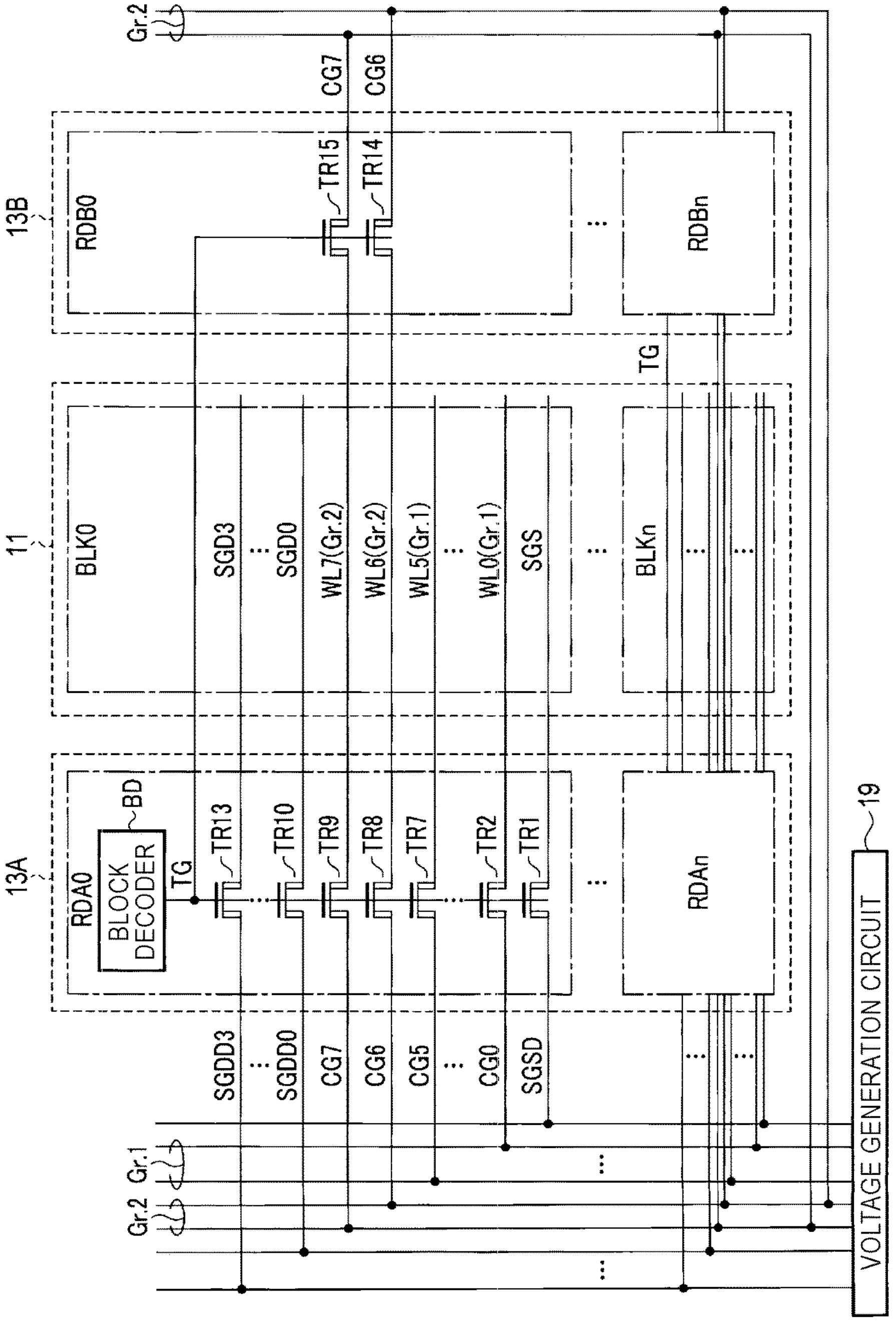
FIG. 6 is a circuit diagram of a row decoder module provided in the semiconductor memory device according to the first exemplary embodiment.

Next, the configuration of the row decoder module 13 will be described with reference to FIG. 6. FIG. 6 illustrates a circuit diagram of the row decoder module 13. As illustrated in FIG. 6, a row decoder module 13A includes row decoders RDA0 to RDAn, and a row decoder module 13B includes row decoders RDB0 to RDBn.

The row decoders RDA0 and RDB0 are associated with a block BLK0, and the row decoders RDAn and RDBn are associated with a block BLKn. That is, a set of row decoders RDA and RDB is associated with one block BLK. Hereinafter, the detailed configurations of row decoders RDA and RDB will be described by focusing on the row decoders RDA0 and RDB0 corresponding to the block BLK0.

The row decoder RDA includes a block decoder BD and high breakdown voltage n-channel MOS transistors TR1 to TR13, and the row decoder RDB includes high breakdown voltage n-channel MOS transistors TR14 and TR15.

The block decoder BD decodes a block address BA to apply a predetermined voltage to a transfer gate line TG based on the result of decoding. The transfer gate line TG is commonly connected to the gates of the transistors TR1 to TR15.

The transistors TR1 to TR15 are connected between various signal lines wired from the voltage generation circuit 19 and various wirings of the associated block BLK. Specifically, one end of the transistor TR1 is connected to a signal line SGSD, and the other end of the transistor TR1 is connected to a select gate line SGS. One ends of the transistors TR2 to TR9 are connected to signal lines CG0 to CG7, respectively, and the other ends of the transistors TR2 to TR9 are connected to one ends of word lines WL0 to WL7, respectively. One ends of the transistors TRIO to TR13 are connected to signal lines SGDD0 to SGDD3, respectively, and the other ends of the transistors TRIO to TR13 are connected to select gate lines SGD0 to SGD3, respectively. One ends of the transistors TR14 and TR15 are connected to signal lines CG6 and CG7, respectively, and the other ends of the transistors TR14 and TR15 are connected to the other ends of word lines WL6 and WL7, respectively.

In this way, the word lines W0 to W5 are driven from one side of the word lines WL by the row decoder RDA, and the word lines WL6 and WL7 are driven from both sides of the word lines WL by the row decoder RDB. In the following description, the word lines WL and the signal lines CG corresponding to the one-side driving will be referred to as word lines WL and signal lines CG of a first group (Gr. 1), and the word lines WL and the signal lines CG corresponding to the both-side driving will be referred to as word lines WL and signal lines CG of a second group (Gr. 2).

The row decoder module 13 may select the block BLK that executes various operations. Specifically, in various operations, the block decoder BD corresponding to the selected and non-selected blocks BLK respectively applies the voltages at the "H" level and the "L" level to the transfer gate line TG. The voltages at the "H" level and the "L" level are voltages that bring the n-channel MOS transistors into the on-state and the off-state, respectively, when the voltages are applied to the gates of the n-channel MOS transistors. For example, when the block BLK0 is selected, the transistors TR1 to TR15 included in the row decoders RDA0 and RDB0 are turned on, and the transistors TR1 to TR15 included in the other row decoders RDA and RDB are turned off. As a result, a current path is formed between the word lines WL and the select gate lines SGD and SGS of the block BLK0 and various signal lines, and a current path is blocked between the word line WL and the select gate lines SGD and SGS of the other blocks BLK and various signal lines.

[1-1-5] Configuration of Voltage Generation Circuit 19

Figure 7:
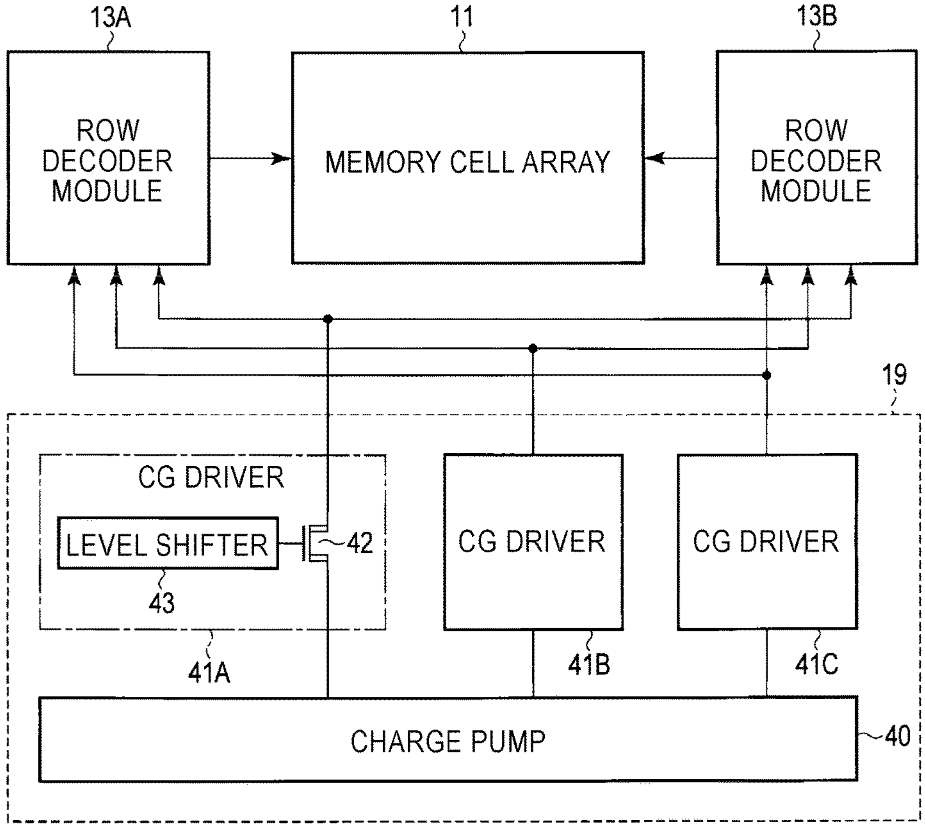
FIG. 7 is a block diagram of a voltage generation circuit provided in the semiconductor memory device according to the first exemplary embodiment.

Next, descriptions will be made on a configuration of the voltage generation circuit 19 with reference to FIG. 7. FIG. 7 illustrates a block diagram of the voltage generation circuit 19. As illustrated in FIG. 7, the voltage generation circuit 19 includes a charge pump 40 and CG drivers 41A, 41B, and 41C.

The charge pump 40 is a circuit that generates a desired voltage based on the control of the sequencer 17. Further, the charge pump 40 may supply different voltages to the CG drivers 41A, 41B, and 41C, respectively, and may change the ramp rate of the voltage supplied to each CG driver 41.

The CG driver 41 is a driver that generates the voltage applied to the word lines WL from the voltage supplied from the charge pump 40. The CG drivers 41A, 41B, and 41C correspond to, for example, a selected word line, a non-selected word line of the first group, and a non-selected word line of the second group, respectively. Each CG driver 41 includes a high breakdown voltage n-channel transistor 42 and a level shifter 43.

The transistor 42 is connected between the charge pump 40 and the row decoder module 13, and the gate of the transistor 42 is connected to the level shifter 43. The level shifter 43 controls the voltage applied to the gate of the transistor 42 based on the control of the sequencer 17. That is, the level shifter 43 causes the voltage supplied from the charge pump 40 to be transmitted to the row decoder module 13 by turning on the transistor 42 based on the control of the sequencer 17.

Specifically, the voltages transmitted by the CG drivers 41A, 41B, and 41C are applied to a desired signal line CG via a selector (not illustrated). The selector is controlled by the sequencer 17 based on a page address PA. Further, the sequencer 17 may apply different enable timings to respective CG drivers 41 based on page addresses PA. The enable timing represents the timing when each CG driver 41 starts supplying a voltage to a signal line.

In addition, the above-described configuration of the voltage generation circuit 19 is not limited thereto. For example, the voltage generation circuit 19 may include an SG driver that generates the voltage applied to the select gate lines SGD and SGS, an SL driver that generates the voltage applied to the source line SL, and other drivers.

[1-1-6] Structure of Semiconductor Memory Device 10

Figure 8:
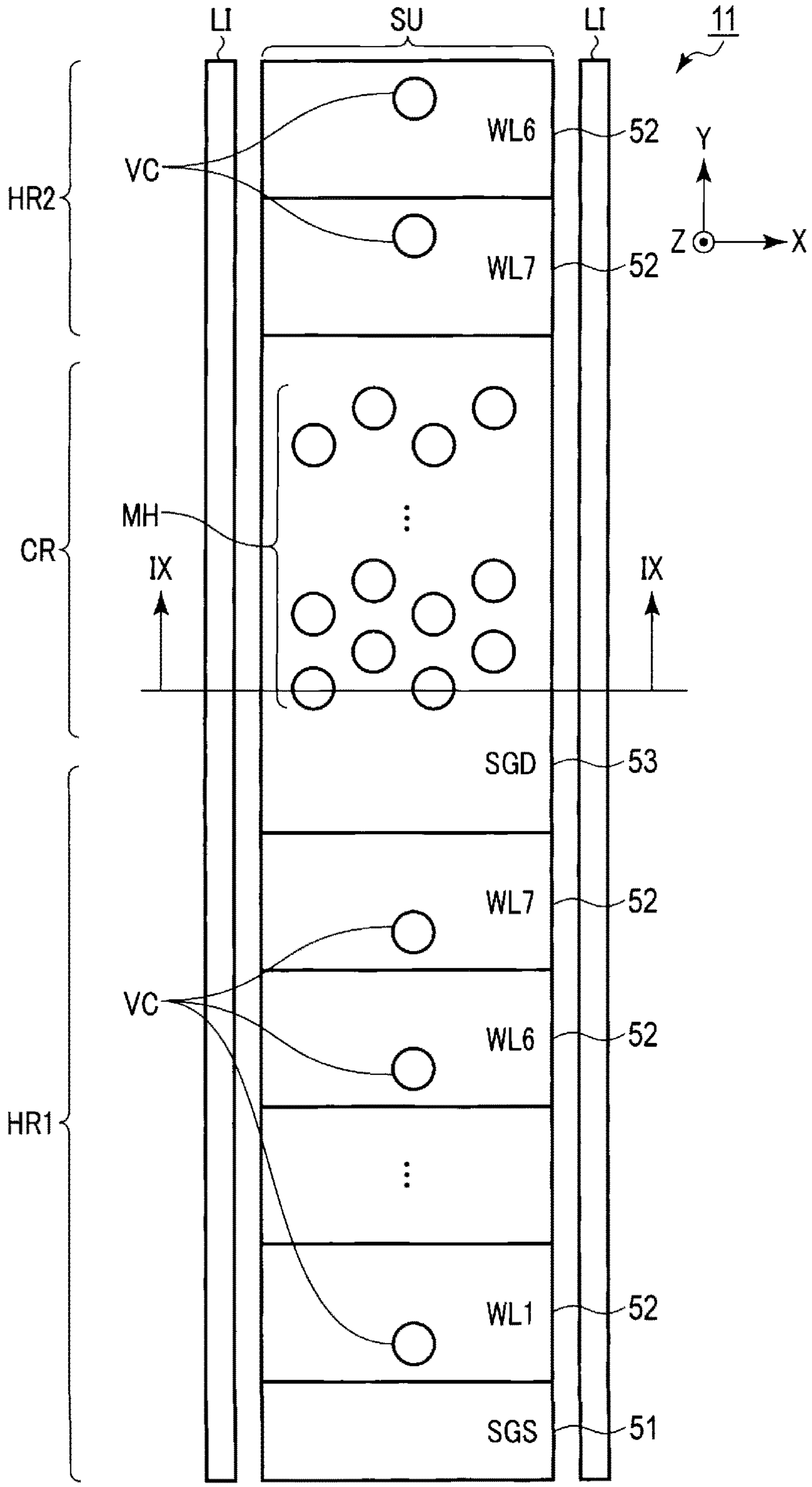
FIG. 8 is a plan layout view of the memory cell array provided in the semiconductor memory device according to the first exemplary embodiment.

Next, the structure of the semiconductor memory device 10 will be described. The semiconductor memory device 10 according to the first exemplary embodiment has a structure in which the row decoder module 13 is provided under the memory cell array 11. In the first exemplary embodiment, the planar layout of the memory cell array 11 is illustrated in, for example, FIG. 8. FIG. 8 illustrates an example of the planar layout of the memory cell array 11 in which one string unit SU is extracted and X, Y, and Z axes intersect with each other. Further, the Z direction corresponds to the vertical direction relative to the surface of a semiconductor substrate.

As illustrated in FIG. 8, the string unit SU extends in the Y direction and is divided into 3 regions (CR, HR1, and HR2) along the Y direction. Hereinafter, descriptions will be made of the detailed structure of the region CR in the memory cell array 11 and the detailed structure of the regions HR1 and HR2 in the memory cell array 11 and the row decoder module 13.

First, the detailed structure of the region CR in the memory cell array 11 will be described. The region CR is a region in which a plurality of memory cells are provided and is disposed between the region HR1 and the region HR2. Specifically, a plurality of semiconductor pillars MH are provided in the region CR, and one semiconductor pillar MH corresponds to, for example, one NAND string NS. That is, the region CR functions as a data holding region.

Figure 9:
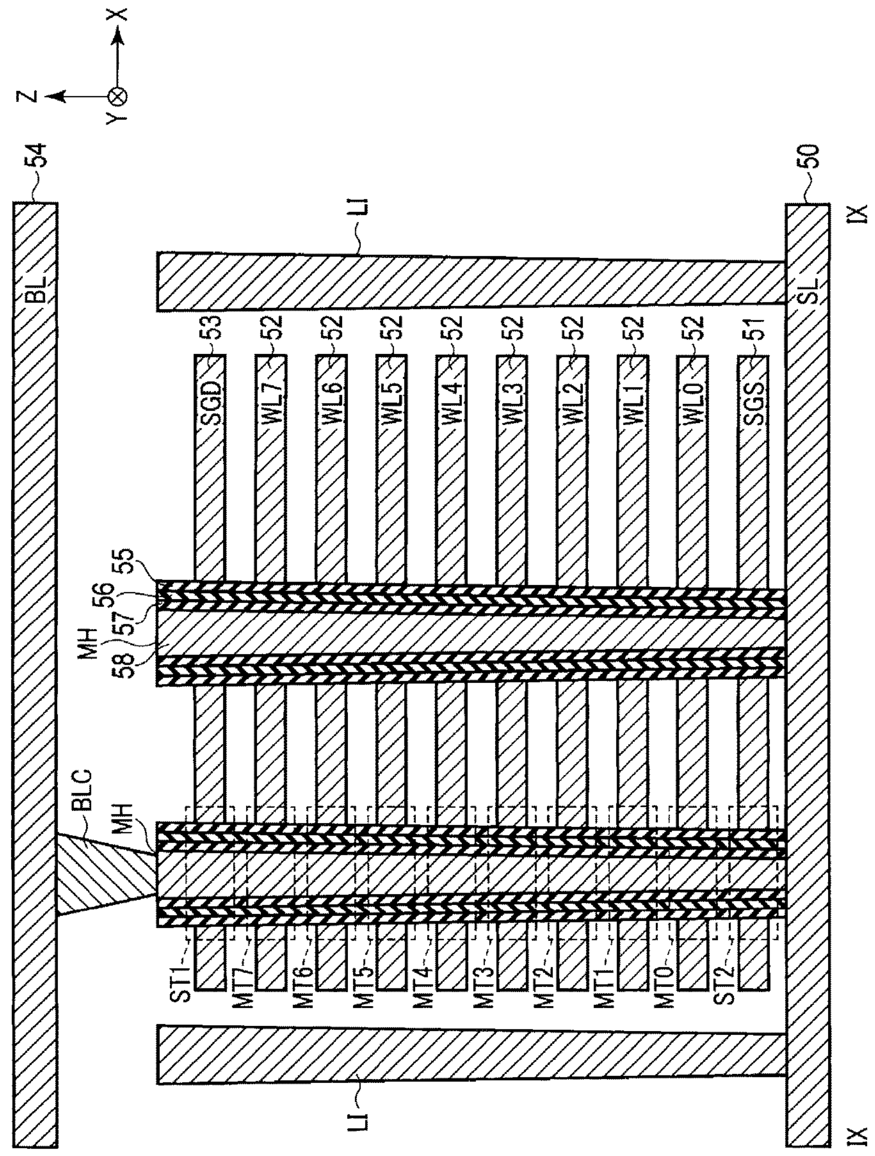
FIG. 9 is a cross-sectional view of the memory cell array taken along line IX-IX illustrated in FIG. 8.

An example of the cross-sectional structure of the region CR in the memory cell array 11 is illustrated in FIG. 9. FIG. 9 is a cross-sectional view taken along line IX-IX of the memory cell array 11 of FIG. 8. The drawings used in the following description omit an interlayer insulating film.

As illustrated in FIG. 9, the memory cell array 11 is provided with a conductor 50, a conductor 51, a plurality of conductors 52, a conductor 53, and a conductor 54 in this order along the Z direction from the lower layer toward the upper layer. The conductors 50 to 53 are each provided in a plate shape widened in the X direction and the Y direction, and function as a source line SL, a select gate line SGS, word lines WL, and a select gate line SGD, respectively. Further, the conductors 52 of eight layers illustrated in FIG. 9 correspond to the word lines WL0 to WL7 in this order from the lower layer. The conductor 54 extends in the X direction and functions as a bit line BL. In this way, the string unit SU in the region CR has a stacked structure in which conductors including the select gate line SGS, the word lines WL0 to WL7, and the select gate line SGD are provided alternately with an insulating film.

The semiconductor pillars MH are formed to reach the upper surface of the conductor 50 from the upper surface of the conductor 53. That is, the semiconductor pillars MH are provided to pass through the conductors 51 to 53 in the Z direction. The semiconductor pillars MH include a block insulating film 55, an insulating film (known as a charge storage layer) 56, a tunnel oxidation layer 57, and a conductive semiconductor material 58. Specifically, the tunnel oxidation film 57 is provided around the semiconductor material 58, the insulating film 56 is provided around the tunnel oxidation film 57, and the block insulating film 55 is provided around the insulating film 56. Further, the semiconductor material 58 may include a plurality of materials.

In this structure, the intersection portion of the conductor 51 and the semiconductor pillar MH functions as the select transistor ST2, the intersection portion between the conductor 52 and the semiconductor pillar MH functions as the memory cell transistor MT, and the intersection portion between the conductor 53 and the semiconductor pillar MH functions as the select transistor ST1. Further, the semiconductor pillars MH arranged in the X direction are respectively connected to different bit lines BL in the same string unit SU. Specifically, a conductive via contact BLC is provided between one end of the semiconductor material 58 in the Z direction and the corresponding conductor 54 (bit line BL).

The above-described stacked structure of the memory cell array 11 corresponds to one string unit SU and a plurality of stacked structures are arranged in the X direction. A slit in which an insulator is embedded is provided between the adjacent string units SU in the X direction, and the conductors 51 to 53 of the adjacent stacked structure are separated from each other. In this slit, for example, a contact plug LI is provided in a plate shape extending in the Y and Z directions from the conductor 50. In other words, one string unit SU is provided between adjacent contact plugs LI, for example, in the X direction.

Further, the above-described structure of the memory cell array 11 is not limited thereto. For example, the select gate lines SGS and SGD as described above are configured with one-layer conductors 51 and 53, respectively, but the select gate lines SGS and SGD may be configured with a multiple-layer conductors. In addition, in the above description, the number of the conductors 52 through which one semiconductor pillar MH passes is not limited to eight. For example, by setting the number of the conductors 52 through which one semiconductor pillar MH passes to 9 or more, the number of the memory cell transistors MT provided in one NAND string NS may be set to 9 or more.

Next, the detailed structure of the regions HR1 and HR2 in the memory cell array 11 and the row decoder module 13 will be described. The region HR1 is a region for connecting wirings between the conductors 51 to 53 provided for each string unit SU and the row decoder module 13A, and the region HR2 is a region for connecting wirings between the conductors 51 to 53 provided for each string unit SU and the row decoder module 13B.

As illustrated in FIG. 8, the conductor 51 corresponding to the select gate line SGS, the conductors 52 corresponding to the word lines WL0 to WL7, and the conductor 53 corresponding to the select gate line SGD are disposed such that one ends thereof in the Y direction is drawn out from the region CR toward the region HR1, and the conductors 52 corresponding to the word lines WL6 and WL7 are disposed such that the other ends thereof in the Y direction is drawn out from the region CR toward the region HR. In other words, the conductors 51 and 52 in the region HR1 has a wiring drawing portion which is not overlapped by the upper conductors 52 and 53, and the conductor 52 in the region HR2 has a wiring drawing portion which is not overlapped by the upper conductors 52 and 53. That is, the end portions of the conductors 51 to 53 in the region HR1 and the end portions of the conductors 52 and 53 in the region HR2 are provided, for example, in a step shape. Also, conductive via contacts VC are provided in the wiring drawing portions of the word lines WL0 to WL7 in the region HR1 and the wiring drawing portions of the word lines WL6 and WL7 in the region HR2.

Figure 10:
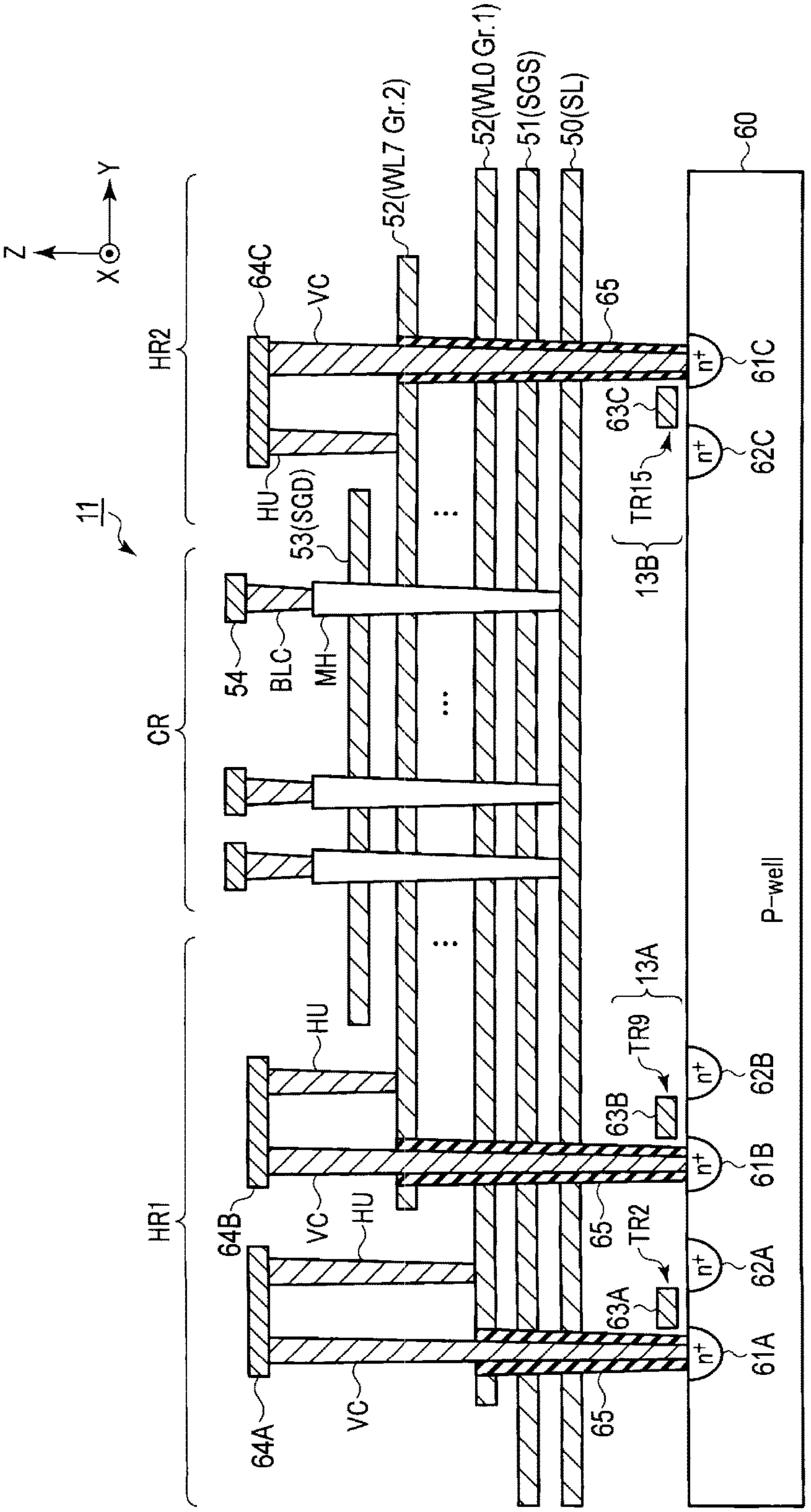
FIG. 10 is a cross-sectional view of the memory cell array and the row decoder module provided in the semiconductor memory device according to the first exemplary embodiment.

FIG. 10 illustrates an example of a cross-sectional structure in the regions HR1 and HR2 of the memory cell array 11 and the row decoder module 13. FIG. 10 is a cross-sectional view taken along the Y direction of the string unit SU in FIG. 8 and includes a cross-section of the via contacts VC in the regions HR1 and HR2 and a cross-section of the semiconductor pillars MH in the region CR. Further, FIG. 10 illustrates the details of elements related to the word lines WL0 and WL7 and omits the wirings corresponding to the other word lines WL and the like. In addition, since the detailed cross-sectional structure of the semiconductor pillars MH is the same as the structure of the semiconductor pillars MH described with reference to FIG. 9, the detailed cross-sectional structure thereof is omitted.

As illustrated in FIG. 10, the row decoder modules 13A and 13B are provided on the substrate of the semiconductor memory device 10. Specifically, a P-type well region 60 is provided on the substrate of the semiconductor memory device 10, and a plurality of n+ impurity diffusion regions 61 and 62 (including diffusion regions 61A, 61B, 61C, and diffusion regions 62A, 62B, 62C) are formed on the surface of the P-type well region 60. A conductor 63 (including conductors 63A, 63B, 63C) is provided between a set of diffusion regions 61 and 62 and on the P-type well region 60 via a gate insulating film (not illustrated). The set of diffusion regions 61 and 62 and the conductor 63 correspond to a transistor TR illustrated in FIG. 6. That is, the diffusion regions 61 and 62 and the conductor 63 correspond to the source, drain, and gate of the transistor TR, respectively.

In the regions HR1 and HR2, the conductors 64 are provided above the wiring drawing portion of the conductors 52 which is not overlapped by the upper conductors 52 and 53. Specifically, for example, the conductor 64 is provided in the wiring layer between the wiring layer provided with the conductor 53 and the wiring layer provided with the conductors 54. Further, the wiring layer provided with the conductor 64 is not limited thereto and may be provided, for example, on the same wiring layer or on the wiring layer above the conductors 54.

In the region HR1, the wiring drawing portion of the conductor 52 corresponding to the word line WL0 is connected to the conductor 64A via a conductive via contact HU. The conductor 64A is connected to a diffusion region 61A via a via contact VC. The spaces between the via contacts VC and the conductors 50 to 53 are insulated by insulating films 65. Further, in the following description, it is assumed that the space between each via contact VC and the conductors 50 to 53 is insulated by the insulating film 65.

Likewise, the wiring drawing portion of the conductor 52 corresponding to the word line WL7 in the region HR1 is connected to a conductor 64B via a via contact HU. The conductor 64B is connected to a diffusion region 61B via a via contact VC. The wiring drawing portion of the conductor 52 corresponding to the word line WL7 in the region HR2 is connected to a conductor 64C via a via contact HU. A conductor 64C is connected to a diffusion region 61C via a via contact VC.

That is, in the conductor 52 corresponding to the word line WL7, one end thereof in the Y direction is connected to the source of the transistor TR9 via the via contacts VC and HU and the conductor 64B, and the other end thereof in the Y direction is connected to the source of the transistor TR15 via the via contacts VC and HU and the conductor 64C. On the contrary, in the conductor 52 corresponding to the word line WL0, one end thereof in the Y direction is connected to the source of the transistor TR2 via the via contacts VC and HU and the conductor 64A, and the other end thereof in the Y direction is not connected to the transistor TR on the semiconductor substrate. That is, at the other end thereof in the Y direction in the conductor 52 corresponding to the word line WL0, for example, the corresponding via contacts VC and HU and the conductor 64 are not provided, and the other end is covered with an interlayer insulating film. As described above, the conductors 52 corresponding to the word lines WL of the first group are connected to the row decoder module 13 provided below the source lines SL in the region HR1, and the conductors 52 corresponding to the word lines WL of the second group are connected to the row decoder module 13 provided below each source line SL in the regions HR1 and HR2.

Further, in the foregoing description, a case where the via contact VC, to which each conductor 52 is electrically connected, passes through the conductor 52, has been described as an example, but the present disclosure is not limited thereto. For example, the via contact VC corresponding to conductor 52 (WL0) may pass through the conductor 50 from the conductor 52 (WL0) to be connected to the corresponding diffusion region 61 like the via contact VC connected to the conductor 64A.

Further, in the foregoing description, a case where the via contacts BLC, VC, and HU are formed by a single-stage pillar has been described as an example, but the present disclosure is not limited thereto. For example, these via contacts may be formed by connecting multi-stage pillars. Further, when multi-pillars are connected in this way, different conductors may be used.

In addition, in the above-described regions HR1 and HR2, for example, the conductor 52 corresponding to the same string unit SU and the same word line WL may be short-circuited via the conductor 64 or the other conductor connected to the conductor 64.

[1-2] Operation

[1-2-1] Read Operation

Next, the read operation of the semiconductor memory device 10 will be described. In the read operation of the semiconductor memory device 10 according to the first exemplary embodiment, the time of the read operation when a word line WL of the first group (one-side driving group) is selected is different from the time of the read operation when a word line WL of the second group (both-side driving group) is selected. Hereinafter, the read operation of selecting a word line WL of the first group will be referred to as a first read operation and the read operation of selecting a word line WL of the second group will be referred to as a second read operation.

Figure 11:
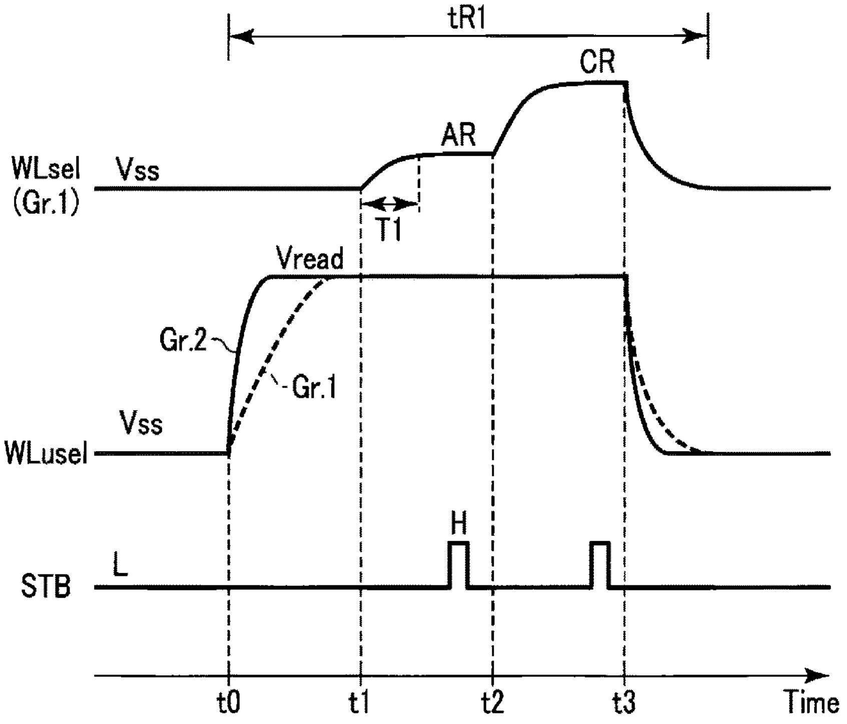
FIG. 11 is a timing chart of a first read operation in the semiconductor memory device according to the first exemplary embodiment.

First, the first read operation in the semiconductor memory device 10 will be described with reference to FIG. 11. In FIG. 11, exemplary waveforms when upper bit data is read from the memory cell in which data is stored by the MLC method are represented, in which waveforms of the voltages applied to a selected word line WLsel (Gr. 1) and a non-selected word lines WLusel of the first group and of the control signal STB are represented.

As illustrated in FIG. 11, at the initial state before time t0, the row decoder module 13 applies a voltage Vss to the selected word line WLsel and the non-selected word line WLusel of the first group.

At time t0, a read pass voltage Vread is applied to the non-selected word line WLusel (Gr. 1) of the first group from one side by the row decoder module 13A, and the read pass voltage Vread is applied to the non-selected word line WLusel (Gr. 2) of the second group from both sides by the row decoder modules 13A and 13B. At this time, in the non-selected word lines WLusel, the non-selected word line WLusel (Gr. 2) of the second group rises up to the voltage Vread faster than the non-selected word line WLusel (Gr. 1) of the first group.

At time t1, a read voltage AR is applied to the selected word line WLsel (Gr. 1) of the first group from one side by the row decoder module 13A. Here, time T1 is the time for the selected word line WLsel (Gr. 1) of the first group to rise from the voltage Vss to the read voltage AR. The sequencer 17 also asserts the control signal STB while the voltage of the selected word line WLsel (Gr. 1) is the read voltage AR. Each sense amplifier unit SAU then determines the read data from the voltage of the corresponding bit line BL at the timing at which the control signal STB is asserted, and holds this data in any one of the internal latch circuits.

At time t2, a read voltage CR is applied to the selected word line WLsel (Gr. 1) of the first group from one side by the row decoder module 13A. The sequencer 17 also asserts the control signal STB while the voltage of the selected word line WLsel (Gr. 1) is the read voltage CR. Each sense amplifier unit SAU then determines the read data from the voltage of the corresponding bit line BL at the timing at which the control signal STB is asserted, and holds this data in any one of the internal latch circuits.

At time t3, the row decoder modules 13A and 13B apply the voltage Vss to each word line WL. At this time, in the non-selected word lines WLusel, the non-selected word line WLusel (Gr. 2) of the second group falls down to the voltage Vss faster than the non-selected word line WLusel (Gr. 1) of the first group. Further, the sense amplifier unit SAU calculates upper bit data based on the read data in the voltage AR held internally and the read data in the voltage CR. The upper bit data is then transmitted to an external controller via the latch circuit XDL.

The above description corresponds to the first read operation. The time at which the first read operation is performed is referred to as tR1 and will be used in the following description.

Figure 12:
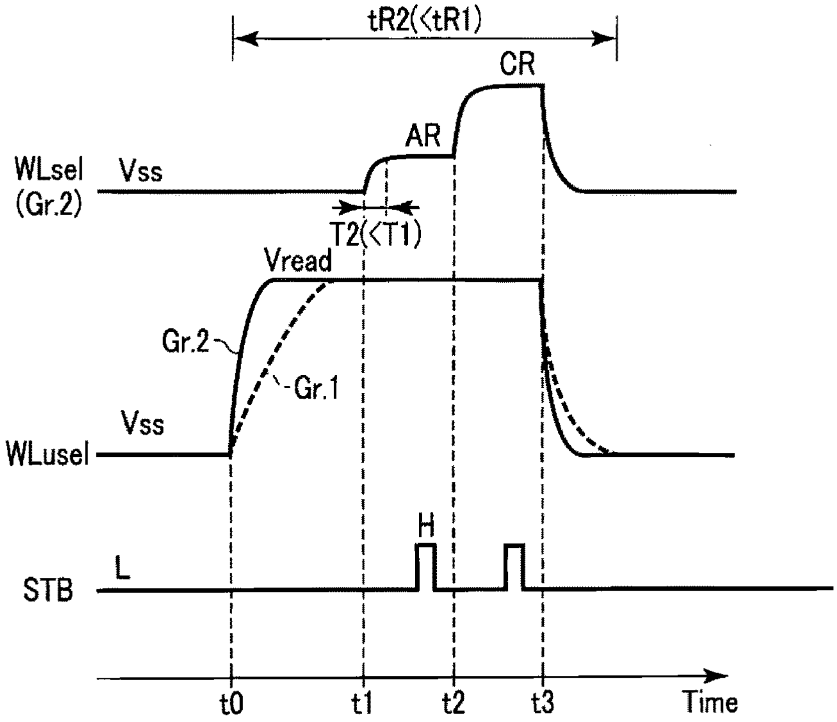
FIG. 12 is a timing chart of a second read operation in the semiconductor memory device according to the first exemplary embodiment.

Next, FIG. 12 will be used to describe the second operation in the semiconductor memory device 10, which is different from the first operation. FIG. 12 illustrates an example of waveforms when reading upper bit data from the memory cell in which data is stored by the MLC method and the voltage applied to the selected word line WLsel (Gr. 2) and the non-selected word line WLusel of the second group and the waveforms of the control signal STB. As illustrated in FIG. 12, in the second read operation, the operation timing at each time is earlier than the first read operation described with reference to FIG. 11.

Specifically, at time t1, the read voltage AR is applied to the selected word line WLsel (Gr. 2) of the second group from both sides by the row decoder modules 13A and 13B. At this time, the time T2 for which the selected word line WLsel (Gr. 2) of the second group rises from the voltage Vss to the read voltage AR becomes shorter than the time T1 in the first read operation. In response to this, the sequencer 17 asserts the control signal STB at an earlier timing than the first read operation and shifts to the operation at the subsequent time t2. The operation timing at time t2 is also earlier than the first read operation similarly to the operation timing at time t1. That is, the time tR2 for which the second read operation is performed becomes shorter than the time tR1 for which the first read operation is performed.

Further, in the foregoing description, a case where the upper page data of the memory cell in which two-bit data is stored is read has been described as an example, but even in the case where the lower page data is read, the execution time of the second read operation becomes shorter than the execution time of the first read operation.

[1-2-2] Write Operation

Next, the write operation of the semiconductor memory device 10 will be described. In the write operation, the sequencer 17 repeatedly executes a program loop, which is a combination of a program operation and a verifying-read operation while incrementing a program voltage Vpgm.

The program operation is an operation of applying the program voltage Vpgm to a selected word line WLsel, and increasing the threshold voltage of a write-target memory cell transistor MT. In a write-inhibited memory cell transistor MT, the variation in the threshold voltage is prevented by a self-boosting technique or the like during the application of the program voltage.

The verifying-read operation is a read operation of determining whether the threshold voltage of the memory cell transistor MT reaches a desired threshold voltage. In the verifying-read operation, the first and second read operations described in section [1-2-1] are applicable, and the verifying time when the selected word line WLsel belongs to the second group may be set to be shorter than the verifying time when the selected word line WLsel belongs to the first group.

Hereinafter, the details of the program operation of the semiconductor memory device 10 will be described. In the program operation of semiconductor memory device 10 according to the first exemplary embodiment, the program operation time when a word line WL of the first group (one-side driving group) is selected is different from the program operation time when a word line WL of the second group (both-side driving group) is selected, similarly to the read operation. Hereinafter, the program operation of selecting a word line WL of the first group is referred to as a first program operation, and the program operation of selecting a word line WL of the second group is referred to as a second program operation.

Figure 13:
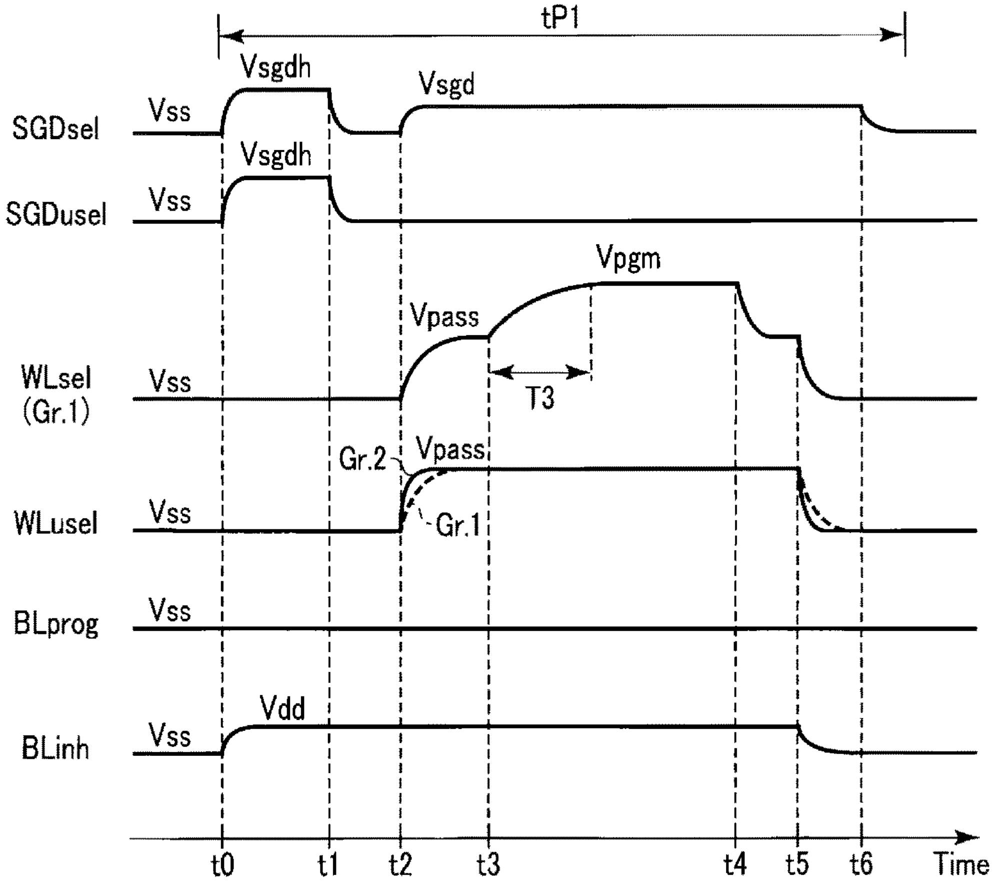
FIG. 13 is a timing chart of a first write operation in the semiconductor memory device according to the first exemplary embodiment.

First, the first program operation in the semiconductor memory device 10 will be described with reference to FIG. 13. FIG. 13 illustrates an example of waveforms of a selected select gate line SGDsel, a non-selected select gate line SGDusel, a selected word line WLsel (Gr. 1) of the first group, a non-selected word line WLusel, a write-target bit line Blprog, and a write-inhibited bit lines Blinh during the program operation.

As illustrated in FIG. 13, at the initial state before time t0, the row decoder module 13 applies the voltage Vss to select gate lines SGD and word lines WL, and the sense amplifier module 12 applies the voltage Vss to bit lines BL.

At time t0, the row decoder module 13A applies a voltage Vsgdh to the select gate lines SGDsel and SGDusel, and the sense amplifier module 12 applies the voltage Vdd to a bit line BLinh. The voltage Vsgdh is a voltage higher than the threshold voltage of the select transistor ST1. When the voltage Vsgdh is applied to the select gate lines SGDsel and SGDusel, the corresponding select transistor ST1 is turned on and a current path is formed between each bit line BL and the corresponding NAND string NS. Further, when the voltage Vdd is applied to the bit line Blinh, the channel potential of the NAND string NS corresponding to the bit line Blinh rises.

At time t1, the row decoder module 13A applies the voltage Vss to the select gate lines SGDsel and SGDusel. When the voltage Vss is applied to the select gate lines SGDsel and SGDusel, the select transistor ST1 is turned off and a channel of the corresponding NAND string NS is in a floating state. At this time, the channel potential of the NAND string corresponding to the write-inhibited bit line BLinh is held in an increased state by the voltage applied between the time t0 and time t1. That is, the channel potential of the NAND string NS corresponding to the bit line Blinh is higher than the channel potential of the NAND string NS corresponding to the bit line Blprog.

At time t2, the row decoder module 13A applies a voltage Vsgd to the select gate line SGDsel. The voltage Vsgd is a voltage higher than the threshold voltage of the select transistor ST1 and lower than the voltage Vsgdh. A write pass voltage Vpass is applied to the selected and non-selected word lines WLsel and WLusel (Gr. 1) of the first group from both sides by the row decoder modules 13A and 13B, and a voltage Vpass is applied to the non-selected word line WLusel (Gr. 2) of the second group from one side by the row decoder module 13A. The write pass voltage Vpass is a voltage higher than the voltage Vsgd. In this case, the non-selected word line WLusel (Gr. 2) of the second group rises up to the voltage Vpass faster than the non-selected word line WLusel (Gr. 1) of the first group. When the voltage Vsgd is applied to the select gate line SGDsel and the voltage Vdd is then applied to the bit line Blinh, the select transistor ST1 is turned off and the channel of the corresponding NAND string NS is brought into a floating state. Further, when the voltage Vpass is applied to the word lines WLsel and WLusel, the channel potential of the NAND string NS which is brought into the floating state is increased by coupling with the word line WL (self-boosting technique). Meanwhile, the channel potential of the NAND string corresponding to the bit line Blprog maintains the voltage Vss applied to the sense amplifier module 12.

At time t3, the program voltage Vpgm is applied to the selected word line WLsel (Gr. 1) of the first group from one side by the row decoder module 13A. Here, time T3 is the time for the selected word line WLsel (Gr. 1) of the first group to rise from the voltage Vpass to the voltage Vpgm. When the voltage Vpgm is applied to the word line WLsel, electrons are injected into the charge storage layer of the write-target memory cell by the potential difference between the word line WLsel and the channel of the NAND string NS corresponding to the bit line BLprog, and the threshold voltage of the memory cell rises. Meanwhile, since the potential difference between the word line WLsel and the channel of the NAND string NS corresponding to the bit line BLinh decreases by self-boosting, the variation in the threshold voltage in the write-inhibited memory cell is prevented.

At time t4, the row decoder module 13A drops the voltage applied to the selected word line WLsel up to Vpass.

At time t5, the row decoder modules 13A and 13B lower the voltages applied to the selected word line WLsel and the non-selected word line WLusel to Vss, and the sense amplifier module 12 lowers the voltage applied to the bit line Blinh to Vss. At this time, the non-selected word line WLusel (Gr. 2) of the second group is lowered to the voltage Vss faster than the non-selected word line WLusel (Gr. 1) of the first group. Then, the channel potential of the NAND string NS which is brought into a floating state is lowered with the decrease in the voltage of the word lines WL.

At time t6, the row decoder module 13A lowers the voltage applied to the select gate line SGDsel to Vss. The select transistor ST1 corresponding to the select gate line SGDsel is then turned off and returns to the initial state. The sequencer 17 then ends the first program operation and, for example, shifts to the verifying operation. The time for which the first program operation is performed is assumed as tP1 and will be used in the following description.

Figure 14:
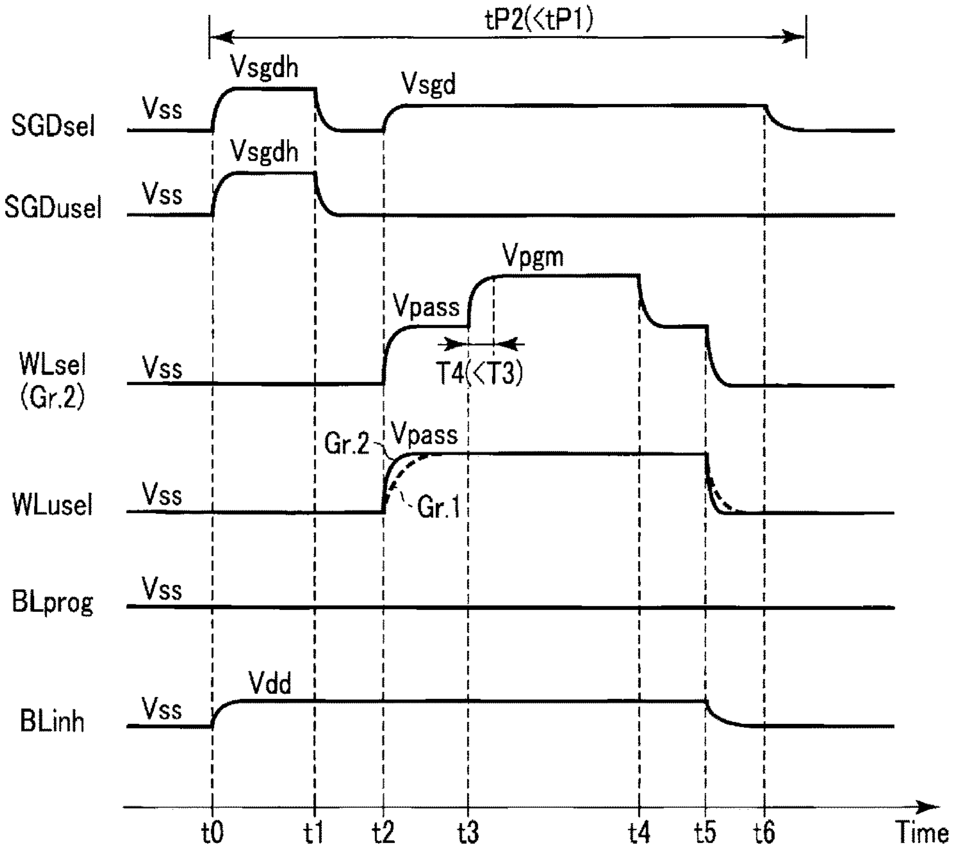
FIG. 14 is a timing chart of a second write operation in the semiconductor memory device according to the first exemplary embodiment.

Next, with reference to FIG. 14, the second program operation in the semiconductor memory device 10 will be described focusing on features different from those of the first program operation. FIG. 14 illustrates an example of waveforms of a selected select gate line SGDsel, a non-selected select gate line SGDusel, a selected word line WLsel (Gr. 2) of the second group, a non-selected word line WLusel, a write-target bit lines Blprog, and a write-inhibited bit lines Blinh during the program operation. As illustrated in FIG. 14, in the second program operation, the operation timing at each time is earlier than the first program operation described with reference to FIG. 13.

Specifically, at time t3, the program voltage Vpgm is applied to the selected word line WLsel (Gr. 2) of the second group from both sides by the row decoder modules 13A and 13B. At this time, the time T4 for which the selected word line WLsel (Gr. 2) of the second group rises from the voltage Vpass to the program voltage Vpgm becomes shorter than the time T3 in the first program operation. Following this, the sequencer 17 shifts to the operation at the subsequent time t4 at an earlier timing than the first read operation. That is, the time tP2 for which the second program operation is performed becomes shorter than the time tP1 for which the first program operation is performed.

[1-3] Effect of First Exemplary Embodiment

With the semiconductor memory device 10 according to the first exemplary embodiment described above, the read operation and the write operation may be accelerated. Hereinafter, the detailed effects of the present disclosure will be described.

In the semiconductor memory device in which memory cells are three-dimensionally stacked, for example, the memory cells are formed by the semiconductor pillars MH illustrated in FIG. 9. Since the semiconductor pillars MH are formed by performing etching with a high aspect ratio, the diameter of the memory pillars MH may vary in each layer. When the diameter of the semiconductor pillars MH changes, the area where the semiconductor pillars MH and the conductors 52 serving as word lines WL contact with each other and the area of the conductors serving as the word lines WL change. Thus, the characteristics of the memory cells are changed according to the diameter of the semiconductor pillars MH.

For example, when the diameter of the semiconductor pillars MH becomes smaller from an upper layer to a lower layer as illustrated in FIG. 9, the coupling capacitance between the word line WL and the semiconductor pillars MH becomes larger in a word line WL corresponding to the upper layer of the semiconductor pillars MH than in a word line WL corresponding to the lower layer of the semiconductor pillars MH. Further, since the diameter of the semiconductor pillars MH is larger in the upper layer, the resistance of the upper word line WL is higher than the resistance of the lower word line WL. For this reason, an RC delay in the upper word line WL is greater than the RC delay in the lower word line WL. As a method of preventing the RC delay, there is a method of driving a word line WL from both sides thereof and a method of broadening the width of a conductor serving as a word line WL.

However, when all word lines WL are driven from both sides, the region for drawing out a wiring layer serving as the word lines WL becomes larger, and as a result, the circuit area of the semiconductor memory device is also increased. In addition, when the width of the conductors serving as the word lines WL becomes larger, the circuit area of the semiconductor memory device is also increased.

Therefore, the semiconductor memory device 10 according to the first exemplary embodiment includes word lines WL driven from only one side and word lines WL driven from both sides. Specifically, the semiconductor memory device 10 according to the first exemplary embodiment includes the row decoder module 13A that applies a voltage from one end of a conductor 52 serving as a word line WL and the row decoder module 13B that applies a voltage from the other end. For example, the lower word lines WL0 to WL5 are driven from one side by the row decoder module 13A, and the upper word lines WL6 and WL7 are driven from both sides by the row decoder modules 13A and 13B.

As described above, in the semiconductor memory device 10 according to the first exemplary embodiment, the row decoder module 13A drives, from one side, the lower word lines WL which have a relatively small RC delay when one-side driving is employed, and the row decoder modules 13A and 13B drive, from both sides, the upper word lines WL which have a relatively large RC delay when one-side driving is employed.

As a result, since a wiring drawing region for driving word lines WL from both sides in the semiconductor memory device 10 may be prevented compared with the case where all word lines WL are driven from both sides, the increase in the circuit area of the semiconductor memory device 10 may be prevented. Further, in the semiconductor memory device 10 according to the first exemplary embodiment, since it is possible to accelerate the operation of selecting an upper word line WL, it is possible to accelerate the read operation and the write operation.

In addition, in the semiconductor memory device 10 according to the first exemplary embodiment, the RC delay in a word line WL driven from both sides is smaller than the RC delay in a word line WL driven from one side. In this case, in the read operation and the write operation, the time for which the voltage of the selected word line WL reaches a desired read voltage and program voltage becomes shorter at a word line WL driven from both sides than at a word line WL driven from one side.

Therefore, in the semiconductor memory device 10 according to the first exemplary embodiment, the operation timing in the case of selecting a word line WL driven from both sides is also made to be earlier than the operation timing in the case of selecting a word line WL driven from one side. Specifically, for example, the period until the sequencer 17 asserts the control signal STB after the row decoder module 13 applies a read voltage in the read operation or the period during which the row decoder module 13 applies a program voltage in the write operation is shortened according to the selected word line WL.

As a result, in the semiconductor memory device 10 according to the first exemplary embodiment, the read operation and the write operation in which a word line WL driven from both sides is selected may be more accelerated than the read operation and the write operation in which a lower word line WL having a relatively small RC delay is selected. Therefore, the semiconductor memory device 10 according to the first exemplary embodiment may further shorten the time for the read operation and the write operation.

Further, in the foregoing description, a case where the semiconductor pillars MH become narrower from the upper layer to the lower layer has been described as an example, but the present disclosure is not limited thereto. For example, the semiconductor pillars MH may have a shape in which a middle layer is expanded. Also, in the semiconductor memory device 10 in which memory cells are three-dimensionally stacked, the semiconductor pillars MH may be vertically connected. Even in this case, in the semiconductor memory device 10, it is possible to improve the operation speed while preventing the increase in the circuit area since a word line WL, which has a large RC delay when driven from one-side, is selectively driven from both sides.

Figure 15:
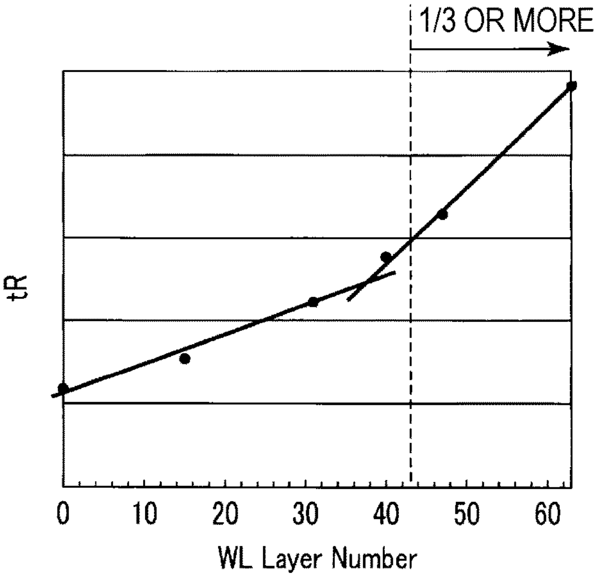
FIG. 15 is a graph illustrating the layer dependency of a read operation speed in the semiconductor memory device.

Further, FIG. 15 illustrates a relationship between a read time and a selected word line WL when 64 layers of word lines WL are stacked in the semiconductor memory device 10 described above. The horizontal axis illustrated in FIG. 15 indicates the layer number corresponding to the selected word lines WL, and the vertical axis illustrated in FIG. 15 indicates the optimum read time tR when the word lines WL are selected.

As illustrated in FIG. 15, in the semiconductor memory device 10 in which memory cells are three-dimensionally stacked, when the word lines WL within ⅓ of the upper layer side of the 64 layers are selected, the read time tends to become slow. Therefore, in the semiconductor memory device 10, the word lines WL within ⅓ of the upper layer side of the stacked word lines WL may be driven from both sides. In this case, the semiconductor memory device 10 is particularly excellent in the balance between the effect of improving the operation speed by both-side driving while limiting the increase in the circuit area.

[2] Second Exemplary Embodiment

Next, the semiconductor memory device 10 according to a second exemplary embodiment will be described. In the semiconductor memory device 10 according to the second exemplary embodiment, ramp rates are changed in a signal line CG corresponding to a non-selected word line WLusel driven from one side and a signal line CG corresponding to a non-selected word line WLusel driven from both sides in the second read operation and the second program operation described in the first exemplary embodiment.

[2-1] Operation

[2-1-1] Read Operation

Figure 16:
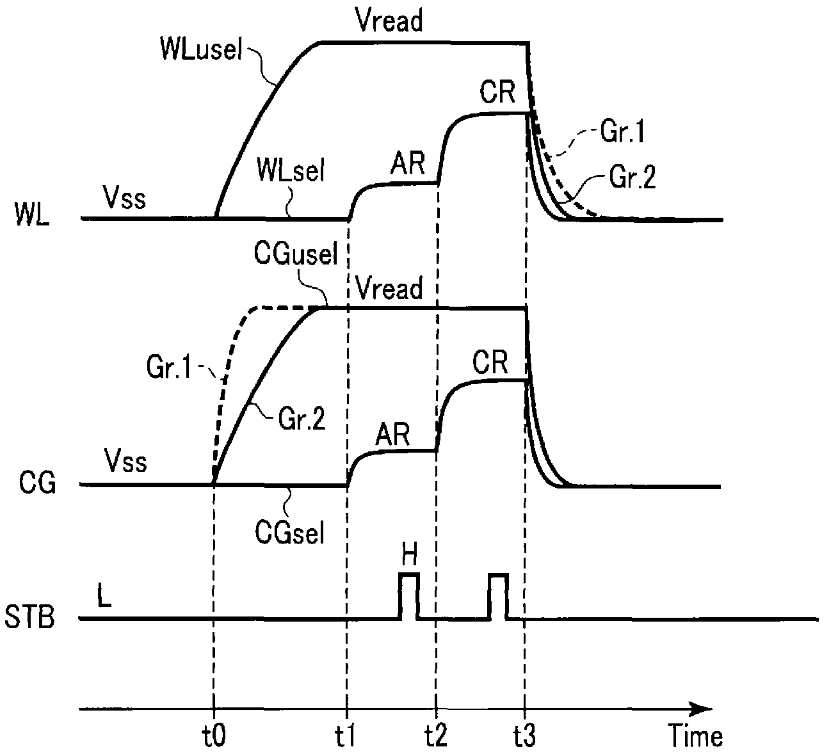
FIG. 16 is a timing chart of a read operation in the semiconductor memory device according to a second exemplary embodiment.

First, the read operation of the semiconductor memory device 10 according to the second exemplary embodiment will be described with reference to FIG. 16. FIG. 16 is a timing chart of the second read operation in the second exemplary embodiment and illustrates the waveforms of word lines WL and corresponding signal lines CG. The operations at time t0 to time t3 illustrated in FIG. 16 respectively correspond to the operations at time t0 to time t3 described with reference to FIG. 12.

Further, in the timing chart used in the following description, the waveforms corresponding to the word lines WL and the signal lines CG of the first group (one-side driving group) are indicated by broken lines, and the waveforms corresponding to the word lines WL and the signal lines CG of the second group (both-side driving group) are indicated by solid lines. In addition, in the following description, a signal line CG corresponding to a selected word line WLsel will be referred to as a selected signal line CGsel, and a signal line corresponding to a non-selected word line WLusel will be referred to as a non-selected signal line CGusel. Further, for the convenience of description, descriptions will be made on a case where a voltage drop by a transistor TR does not occur when the voltage is supplied from a signal line CG to a word line WL via the transistor TR as an example.

As illustrated in FIG. 16, the waveform of the selected signal line CGsel is the same as the waveform of the selected word line WLsel. Meanwhile, the waveform of the non-selected signal lines CGusel is different between the non-selected signal lines CGusel of the first group and the non-selected signal lines CGusel of the second group.

Specifically, at time t0, a read pass voltage Vread is applied to non-selected signal lines CGusel. At this time, the charge pump 40 sets the ramp rate for supplying a voltage to the CG driver 41 corresponding to a non-selected signal line CGusel of the second group to be lower than the ramp rate for supplying a voltage to the CG driver 41 corresponding to a non-selected signal line CGusel of the first group. That is, the non-selected signal line CGusel of the second group reaches the voltage Vread at a later timing than the non-selected signal line CGusel of the first group. Further, the waveform of the non-selected word lines WLusel of the first and second groups are the same as the waveform of the non-selected word line WLusel of the first group illustrated in, for example, FIG. 12. The descriptions of the other operations are omitted since the operations are the same as the second read operation described in the first exemplary embodiment with reference to FIG. 12.

[2-1-2] Write Operation

Figure 17:
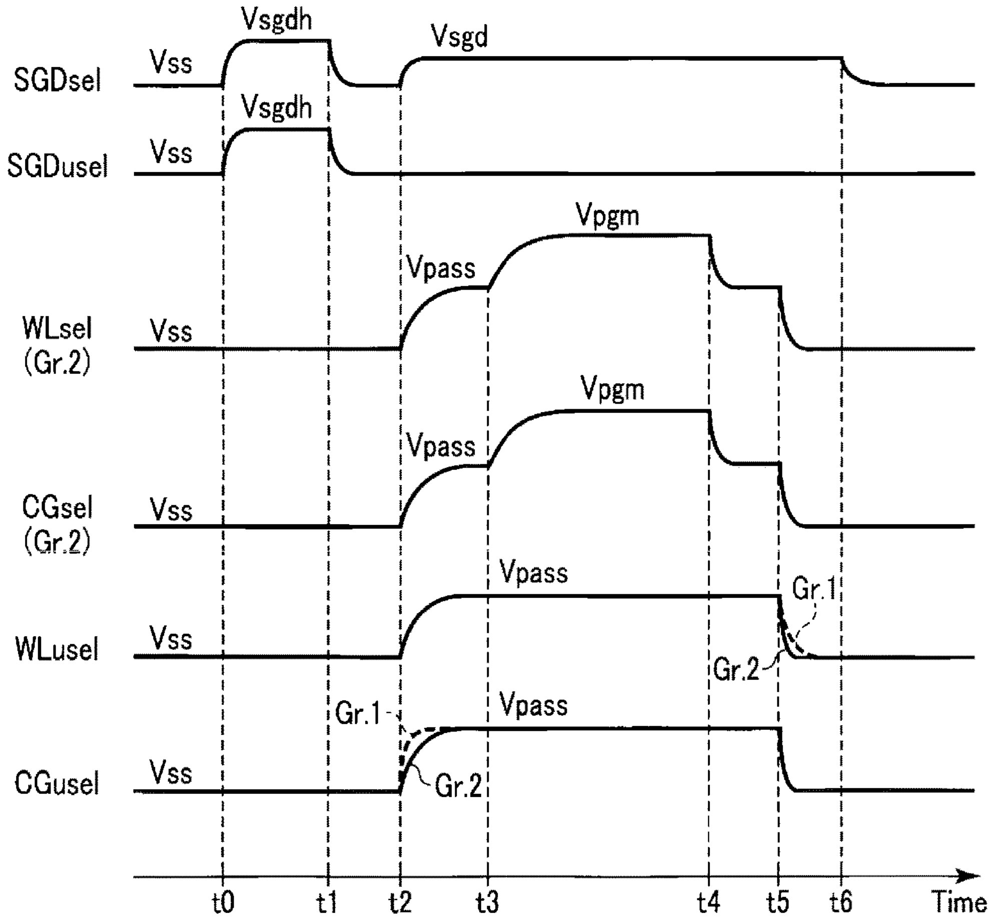
FIG. 17 is a timing chart of a write operation in the semiconductor memory device according to the second exemplary embodiment.

Next, the write operation of the semiconductor memory device 10 according to the second exemplary embodiment will be described with reference to FIG. 17. FIG. 17 is a timing chart of the second program operation in the second exemplary embodiment and illustrates the waveforms of select gate lines SGD, word lines WL, and signal lines CG. The operations at time t0 to time t6 of the second read operation illustrated in FIG. 17 respectively correspond to the operations at time t0 to t6 of the second program operation described with reference to FIG. 14.

As illustrated in FIG. 17, the waveform of the selected signal line CGsel is the same as the waveform of the selected word line WLsel. Meanwhile, the waveform of the non-selected signal line CGusel is different between the non-selected signal line CGusel of the first group and the non-selected signal line CGusel of the second group.

Specifically, at time t2, a voltage Vpass is applied to the non-selected signal line CGusel. At this time, the charge pump 40 sets the ramp rate for supplying a voltage to the CG driver 41 corresponding to the non-selected signal line CGusel of the second group to be lower than the ramp rate for supplying a voltage to the CG driver 41 corresponding to the non-selected signal line CGusel of the first group. That is, the non-selected signal line CGusel of the second group reaches the voltage Vpass at a later timing than the non-selected signal line CGusel of the first group. Further, the waveforms of the non-selected word lines WLusel of the first and second groups are the same as the waveform of the non-selected word line WLusel of the first group illustrated in, for example, FIG. 14.

The operation of the selected signal line CGsel of the second group at time t2 is the same as the operation of the non-selected signal line CGusel of the second group. That is, the selected signal line CGusel of the second group reaches the voltage Vpass at a later timing than the non-selected signal line CGusel of the first group. Further, the ramp rate of the voltage applied to the selected signal line CGsel of the second group at time t3 is lower than the ramp rate of the second write operation described in the first exemplary embodiment. As a result, the time for which the voltage of the selected word line WLsel according to the second exemplary embodiment rises from Vpass to Vpgm becomes longer than the time for which the voltage of the selected word line WLsel according to the first exemplary embodiment reaches from Vpass to Vpgm. The descriptions of the other operations are omitted since the operations are the same as the second program operation described in the first exemplary embodiment with reference to FIG. 14.

[2-2] Effect of Second Exemplary Embodiment

According to the semiconductor memory device 10 in the second exemplary embodiment described above, the reliability of data stored in the memory cell may be improved. Hereinafter, the detailed effect of the present disclosure will be described.

In the semiconductor memory device 10, a word line WL driven from both sides reaches a predetermined voltage earlier than a word line WL driven from one side. That is, even when the row decoder module 13 applies a predetermined voltage to a word line WL driven from one side and a word line WL driven from both sides for the same period, the time during which the predetermined voltage is substantially applied becomes longer at the word line WL driven from both sides than at the word line WL driven from one side.

Specifically, in the read operation, for example, the time during which the read pass voltage Vread is substantially applied to a non-selected word line WLusel driven from both sides becomes longer than the time during which the read pass voltage Vread is substantially applied to a non-selected word line WLusel driven from one side. In this case, there is a possibility that the influence of read disturbance may be larger at the non-selected word line WLusel driven from both sides than at the non-selected word line WLusel driven from one side.

Further, in the write operation, for example, the time during which the voltage Vpass is substantially applied to a non-selected word line WLusel driven from both sides becomes longer than the time during which the voltage Vpass is substantially applied to a non-selected word line WLusel driven from one side. In this case, there is a possibility that the influence of channel boosting may be reduced at the non-selected word line WLusel driven from both sides rather than at the non-selected word line WLusel driven from one side.

Therefore, the semiconductor memory device 10 according to the second exemplary embodiment changes the ramp rates at a signal line CG corresponding to a non-selected word line WLusel driven from both sides and a signal line CG corresponding to a non-selected word line WLusel driven from one side. Specifically, the charge pump 40 sets the ramp rate for supplying a voltage to the CG driver 41 corresponding to a non-selected word line WLusel driven from both sides to be lower than the ramp rate for supplying a voltage to the CG driver 41 corresponding to a non-selected word line WLusel driven from one side.

That is, the semiconductor memory device 10 according to the second exemplary embodiment may delay the timing at which a non-selected word line WLusel driven from both sides reaches a desired voltage. Further, in the semiconductor memory device 10 according to the second exemplary embodiment, by adjusting the ramp rate of the charge pump 40, it is possible to match the timing at which the non-selected word line WL driven from both sides reaches a desired voltage and the timing at which the non-selected word line driven from one side reaches a desired voltage.

As a result, since the semiconductor memory device 10 according to the second exemplary embodiment may shorten the time during which the voltage Vread is applied to a non-selected word line WLusel driven from both sides in the read operation, the influence of read disturbance can be prevented. Further, in the write operation, since the timing at which the voltage Vpass is applied to the non-selected word line WLusel driven from both sides may be matched, the influence of program disturbance caused by reduction in the channel boosting effect can be prevented. Therefore, the semiconductor memory device 10 according to the second exemplary embodiment can improve the reliability of data stored in the memory cells.

Further, in the write operation of the semiconductor memory device 10 according to the second exemplary embodiment, it is also considered that the ramp rate when applying the program voltage Vpgm to a selected word line WLsel driven from both sides is set to be low as illustrated in FIG. 17. In this case, in the selected word line WLsel driven from both sides, the drastic increase in the voltage when the program voltage Vpgm is applied is prevented.

As a result, the semiconductor memory device 10 may have a time during which a channel is sufficiently boosted after the voltage Vpass is applied to the non-selected word line WLusel at time t2. That is, since the selected word line WLsel may reach the program voltage Vpgm at a state where the channel is sufficiently boosted, the program disturbance caused by insufficient channel boosting may be prevented. Therefore, the semiconductor memory device 10 according to the second exemplary embodiment may improve the reliability of data stored in the memory cells.

Further, in the foregoing description, a case where the ramp rates are changed when the voltage Vread in the read operation and the voltages Vpass and Vpgm in the write operation are applied has been described as an example, but the present disclosure is not limited thereto. For example, just one or any two of the above-described operations may be applied to the semiconductor memory device 10.

[3] Third Exemplary Embodiment

Next, the semiconductor memory device 10 according to a third exemplary embodiment will be described. The semiconductor memory device 10 according to the third exemplary embodiment implements the second read operation and the second program operation described in the second exemplary embodiment by a resistance element provided between the voltage generation circuit 19 and the row decoder module 13.

[3-1] Configuration

Figure 18:
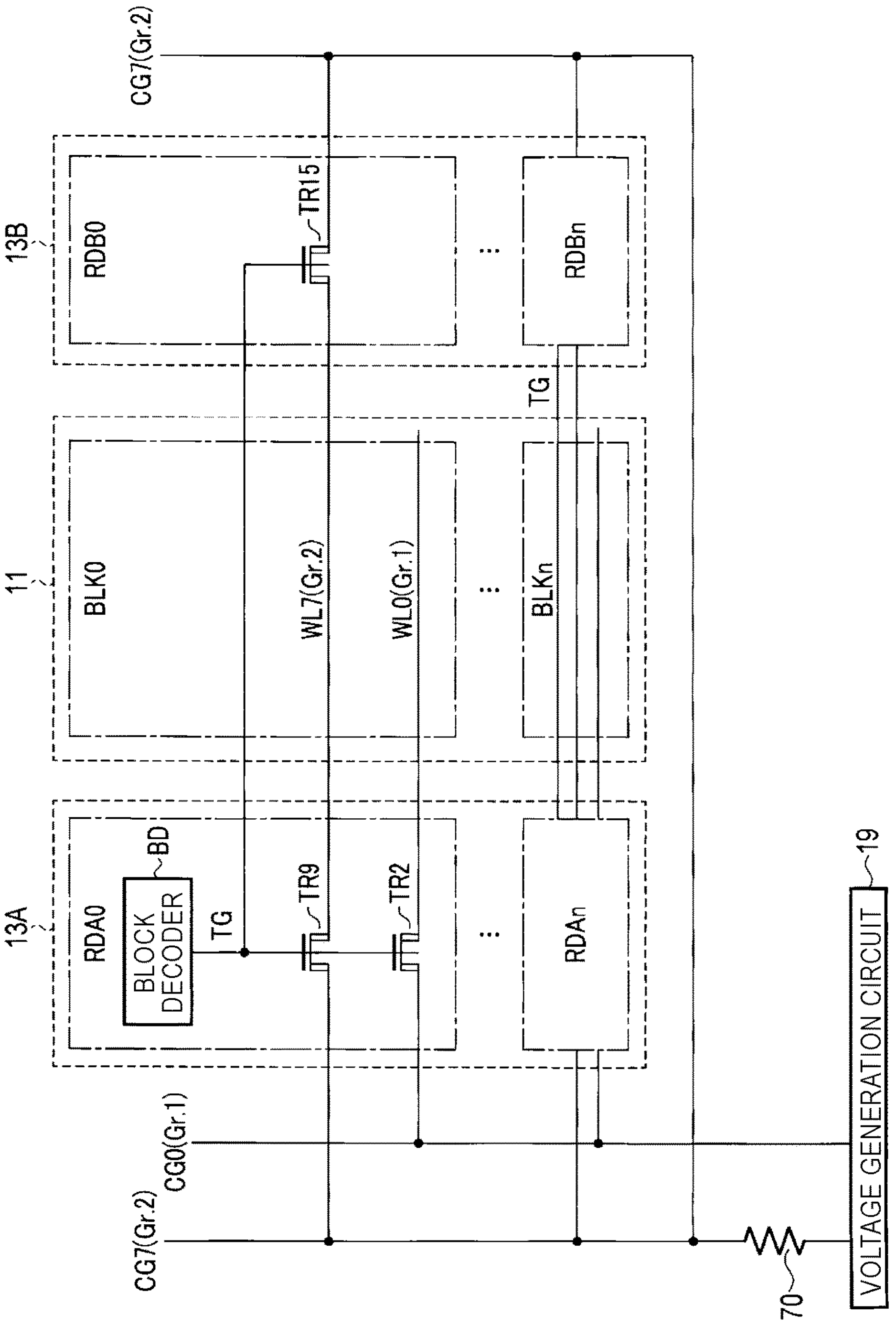
FIG. 18 is a circuit diagram of a row decoder module provided in the semiconductor memory device according to a third exemplary embodiment.

Hereinafter, with reference to FIG. 18, the configuration of the semiconductor memory device 10 according to the third exemplary embodiment will be described focusing on features different from those of the first exemplary embodiment. FIG. 18 is a circuit diagram of the row decoder module 13 according to the third exemplary embodiment and illustrates extracted elements related to a word line WL0 of the first group (one-side driving group) and a word line WL7 of the second group (both-side driving group).

As illustrated in FIG. 18, compared to the circuit configuration of the row decoder module 13 described in the first exemplary embodiment with reference to FIG. 6, the third exemplary embodiment is different in that a resistance element 70 is provided in the middle of a signal line CG (Gr. 2) of the second group. In other words, a signal line CG corresponding to a word line WL driven from both sides is connected to the voltage generation circuit 19 via the resistance element 70.

Specifically, for example, one end of the resistance element 70 is connected to a transistor TR9 of a row decoder RDA0 and a transistor TR15 of a row decoder RDB0 via the signal line CG7 (Gr. 2) of the second group, and the other end of the resistance element 70 is connected to the voltage generation circuit 19.

As for the resistance element 70, for example, a diffusion layer resistance element using a diffusion region formed on the semiconductor substrate is used. The configuration of the resistance element 70 is not limited thereto, and, for example, a PolySi resistance, a WSi resistance, and a wiring resistance may be used for the resistance element 70. The description of the signal line CG (Gr. 1) of the first group is omitted since the configuration thereof is the same as the configuration described in the first exemplary embodiment with reference to FIG. 6.

[3-2] Effect of Third Exemplary Embodiment

As described above, the semiconductor memory device 10 according to the third exemplary embodiment is provided with the resistance element 70 for a signal line CG corresponding to a word line WL driven from both sides. That is, the wiring resistance of a signal line CG of the second group becomes larger than the wiring resistance of a signal line CG of the first group.

For example, assuming that the CG driver 41 applies the same voltage to the signal lines CG, the increase rate in the voltage of the signal line CG (Gr. 2) of the second group becomes smaller than the increase rate in the voltage of the signal line CG (Gr. 2) of the first group.

As described above, the semiconductor memory device 10 according to the third exemplary embodiment may perform the same operation as in the second exemplary embodiment without changing the ramp rate of the charge pump 40 by the sequencer 17 as in the second exemplary embodiment. Therefore, the semiconductor memory device 10 according to the third exemplary embodiment can improve the reliability of data stored in the memory cells as in the second exemplary embodiment, and further, the control of the sequencer 17 can be simplified compared to the second exemplary embodiment.

[4] Fourth Exemplary Embodiment

Next, the semiconductor memory device 10 according to a fourth exemplary embodiment will be described. The semiconductor memory device 10 according to the fourth exemplary embodiment changes enable timing in the second read operation and the second program operation described in the first exemplary embodiment with the CG driver 41 that supplies a voltage to a non-selected word line WLusel driven from one side and to the CG driver 41 that supplies a voltage to a non-selected word line WLusel driven from both sides.

[4-1] Operation

[4-1-1] Read Operation

Figure 19:
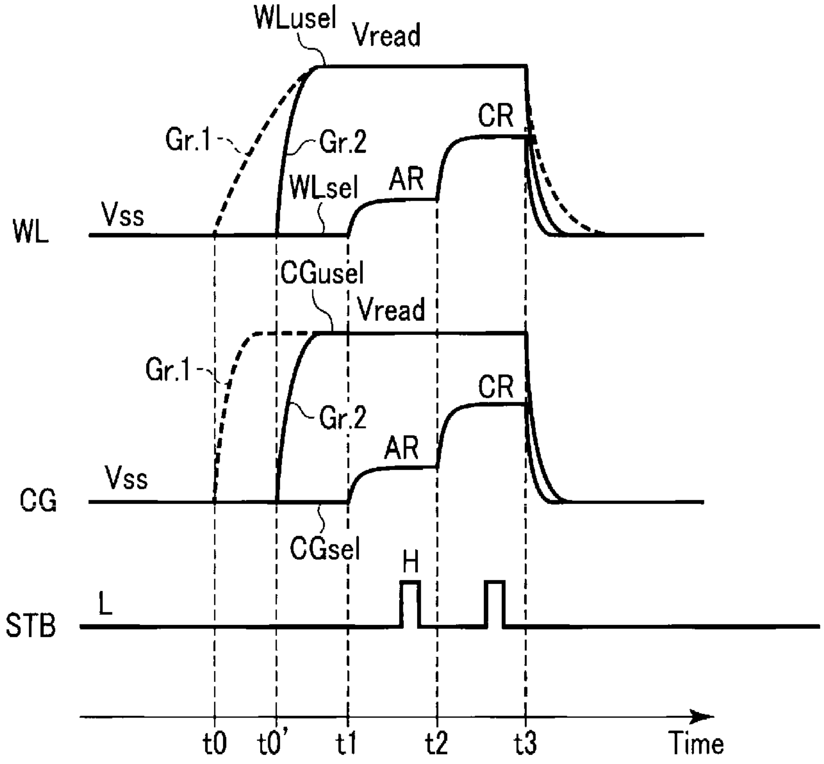
FIG. 19 is a timing chart of a read operation in the semiconductor memory device according to a fourth exemplary embodiment.

First, the read operation of the semiconductor memory device 10 according to the fourth exemplary embodiment will be described with reference to FIG. 19. FIG. 19 is a timing chart of the second read operation according to the fourth exemplary embodiment and illustrates the waveforms of word lines WL and corresponding signal lines CG. The operations at time t0 to time t3 illustrated in FIG. 19 respectively correspond to the operations at time t0 to time t3 described with reference to FIG. 12.

As illustrated in FIG. 19, the waveform of the selected signal line CGsel is the same as the waveform of the selected word line WLsel. Meanwhile, the waveform of the non-selected signal line CGusel is different between the non-selected signal line CGusel of the first group (one-side driving group) and the non-selected signal line CGusel of the second group (both-side driving group).

Specifically, the read pass voltage Vread is applied to the non-selected signal line CGusel of the first group at time t0, and the read pass voltage Vread is applied to the non-selected signal line CGusel of the second group at the subsequent time t0'. That is, the sequencer 17 delays the enable timing of the CG driver 41 corresponding to the second group with respect to the enable timing of the CG driver 41 corresponding to the first group.

As a result, the non-selected signal line CGusel of the second group reaches the voltage Vread at a later timing than the non-selected signal line CGusel of the first group. Further, the waveform of the non-selected word line WLusel of the first group corresponding thereto is the same as the waveform of the non-selected word line WLusel of the first group illustrated in, for example, FIG. 12, and the waveform of the non-selected word line WLusel of the second group corresponds to the waveform of the non-selected word line WLusel of the second group illustrated in, for example, FIG. 12 and shifted by the difference between t0 and t0'. The descriptions of the other operations are omitted since the operations are the same as the second read operation described in the first exemplary embodiment with reference to FIG. 12.

[4-1-2] Write Operation

Figure 20:
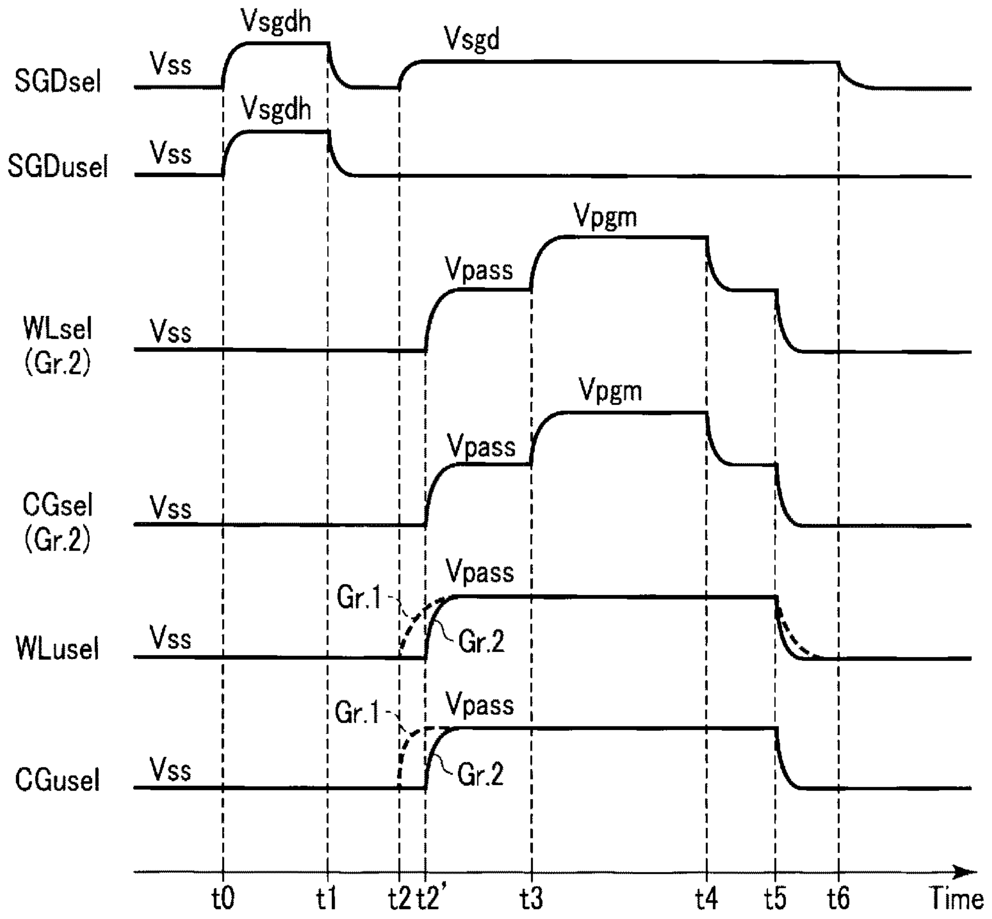
FIG. 20 is a timing chart of a write operation in the semiconductor memory device according to the fourth exemplary embodiment.

Next, with reference to FIG. 20, the write operation of the semiconductor memory device 10 according to the fourth exemplary embodiment will be described focusing on features different from those of the first exemplary embodiment. FIG. 20 is a timing chart of the second program operation in the second exemplary embodiment and illustrates the waveforms of select gate lines SGD, word lines WL, and signal lines CG.

As illustrated in FIG. 17, the waveform of a selected signal line CGsel is the same as the waveform of the selected word line WLsel. Meanwhile, the waveforms of the non-selected signal lines CGusel are different between the non-selected signal line CGusel of the first group (one-side driving group) and the non-selected signal line CGusel of the second group (both-side driving group).

Specifically, the voltage Vpass is applied to the non-selected signal line CGusel of the first group at time t2, and the voltage Vpass is applied to the non-selected signal line CGusel of the second group at the subsequent time t2'. That is, the sequencer 17 delays the enable timing of the CG driver 41 corresponding to the second group with respect to the enable timing of the CG driver 41 corresponding to the first group.

As a result, the non-selected signal line CGusel of the second group reaches the voltage Vpass at a later timing than the non-selected signal line CGusel of the first group. Further, the waveform of the non-selected word line WLusel of the first group corresponding thereto is the same as the waveform of the non-selected word line WLusel of the first group illustrated in, for example, FIG. 14, and the waveform of the non-selected word line WLusel of the second group corresponds to the waveform of the non-selected word line WLusel of the second group illustrated in, for example, FIG. 14 and shifted by the difference between t2 and t2'.

The operation of the selected signal line CGsel of the second group at time t2 is the same as the operation of the non-selected signal line CGusel of the second group. That is, the selected signal line CGsel of the second group reaches the voltage Vpass at a later timing than the non-selected signal line CGusel of the first group. The description of the other operations is omitted since the operations are the same as the second program operation described in the first exemplary embodiment with reference to FIG. 14.

[4-2] Effect of Fourth Exemplary Embodiment

As described above, the semiconductor memory device 10 according to the fourth exemplary embodiment changes the operation timing at a signal line CG corresponding to a word line WL driven from both sides and a signal line CG corresponding to a word line WL driven from one side.

As a result, in various operations in the semiconductor memory device 10 according to the fourth exemplary embodiment, the timing at which a word line WL of the second group reaches a desired voltage may be matched with the timing at which a word line WL of the first group reaches a desired voltage.

As described above, the semiconductor memory device 10 according to the fourth exemplary embodiment may control the timing at which the word line WL driven from both sides reaches a desired voltage in the same manner as in the second exemplary embodiment. Therefore, the semiconductor memory device 10 according to the fourth exemplary embodiment may improve the reliability of data stored in the memory cells in the same manner as in the second exemplary embodiment.

Further, in the write operation of the semiconductor memory device 10 according to the fourth exemplary embodiment, it may also be considered that the operation timing when applying the program voltage Vpgm to the selected word line WLsel driven from both sides is set to be later than the operation timing when applying the program voltage Vpgm to the selected word line WLsel driven from one side. In this case, the operation timing at time t3 in the second program operation described with reference to, for example, FIG. 20 is set to be later than the operation timing at time t3 in the first program operation described in the first exemplary embodiment with reference to FIG. 13.

In this case, the semiconductor memory device 10 may have a time during which a channel is sufficiently boosted after the voltage Vpass is applied to the non-selected word line WLusel at time t2. That is, since the selected word line WLsel may reach the program voltage Vpgm at a state where the channel is sufficiently boosted, the program disturbance caused by insufficient channel boosting can be prevented. Therefore, the semiconductor memory device 10 according to the fourth exemplary embodiment can improve the reliability of data stored in the memory cells.

Further, in the foregoing description, a case where the operation timings are changed when the voltage Vread in the read operation and the voltages Vpass and Vpgm in the write operation are applied has been described as an example, but the present disclosure is not limited thereto. For example, just one or any two of the above-described operations may be applied to the semiconductor memory device 10.

[5] Fifth Exemplary Embodiment

Next, the semiconductor memory device 10 according to a fifth exemplary embodiment will be described. The semiconductor memory device 10 according to the fifth exemplary embodiment applies a kick voltage (i.e., a voltage spike) before applying a predetermined read voltage in the first and second read operations described in the first exemplary embodiment.

[5-1] Operation

Figure 21:
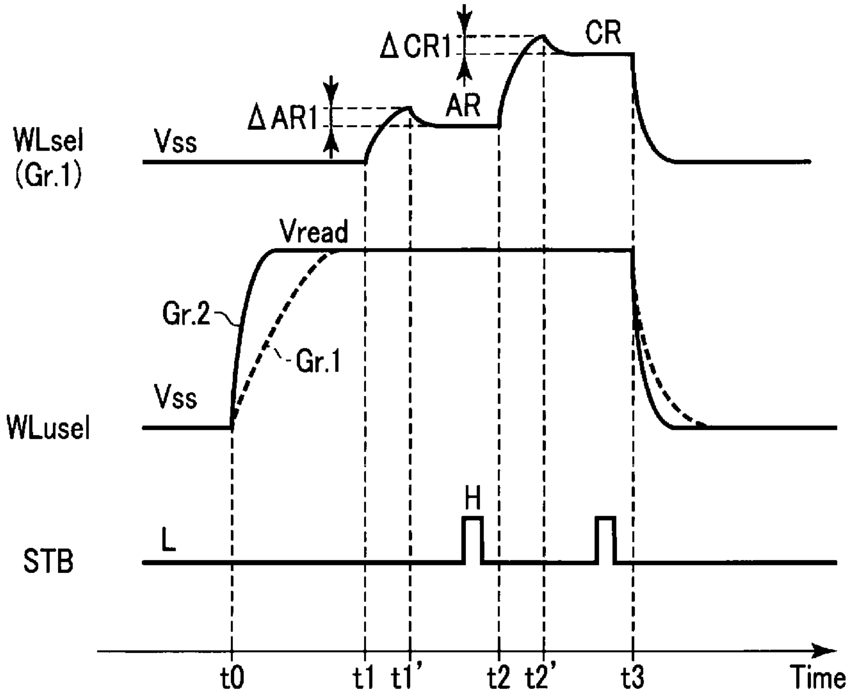
FIG. 21 is a timing chart of a first read operation in the semiconductor memory device according to a fifth exemplary embodiment.
Figure 22:
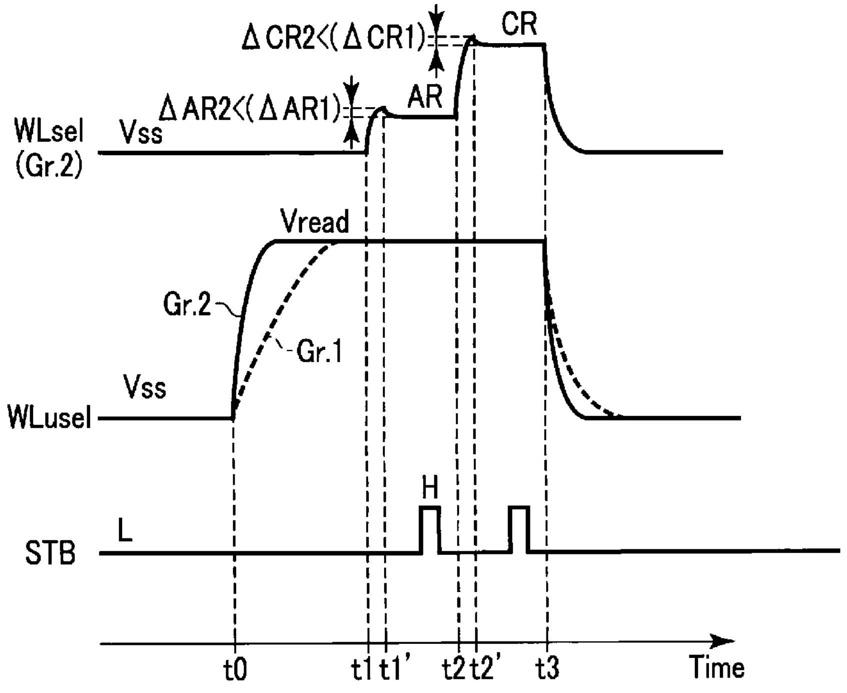
FIG. 22 is a timing chart of a second read operation in the semiconductor memory device according to a fifth exemplary embodiment.

Hereinafter, the read operation of the semiconductor memory device 10 according to the fifth exemplary embodiment will be described with reference to FIGS. 21 and 22. FIGS. 21 and 22 are timing charts of the first and second read operations in the fifth exemplary embodiment, respectively, and illustrate the waveforms of word lines WL and a control signal STB. The operations at time t0 to time t3 illustrated in FIGS. 21 and 22 respectively correspond to the operations at time t0 to time t3 described with reference to FIGS. 11 and 12.

As illustrated in FIGS. 21 and 22, compared to the first and second read operations described in the first exemplary embodiment with reference to FIGS. 11 and 12, the first and second read operations of the fifth exemplary embodiment are different in that a kick voltage is applied before a read voltage is applied.

The kick voltage is set for each read level, and is set to be higher than the corresponding read voltage. As illustrated in FIG. 21, the row decoder module 13A in the first read operation applies the kick voltage AR+ΔAR1 corresponding to the read of the “A” level with respect to the selected word line WLsel (Gr. 1) at time t1, and then lowers the voltage of the selected word line WLsel to the read voltage AR at the subsequent time t1'. Likewise, the row decoder module 13A applies the kick voltage CR+ΔCR1 corresponding to the read of the “C” level with respect to the selected word line WLsel (Gr. 1) at time t2, and then lowers the voltage of the selected word line WLsel to the read voltage CR at the subsequent time t2'.

Meanwhile, in the second read operation, as illustrated in FIG. 22, the row decoder modules 13A and 13B apply the kick voltage AR+ΔAR2 with respect to the selected word line WLsel (Gr. 1) at time t1, and then lower the voltage of the selected word line WLsel to the read voltage AR at the subsequent time t1'. Likewise, the row decoder modules 13A and 13B apply the kick voltage CR+ΔCR2 with respect to the selected word line WLsel (Gr. 1) at time t2, and then lower the voltage of the selected word line WLsel to the read voltage CR at the subsequent time t2'.

In the first and second read operations described above, the voltage of ΔAR2 is set to be lower than ΔAR1, and the voltage of ΔCR2 is set to be lower than ΔCR1. The description of the other operations is omitted since the operations are the same as the first and second read operations described in the first exemplary embodiment with reference to FIGS. 11 and 12.

[5-2] Effect of Fifth Exemplary Embodiment

According to the semiconductor memory device 10 according to a fifth exemplary embodiment described above, the read operation may be accelerated. Hereinafter, the detailed effects of the present disclosure will be described.

In the read operation, there is known a method of accelerating the read operation by temporarily applying a kick voltage before applying a desired read voltage. The kick voltage assists the increase of the voltage in a selected word line WLsel and may shorten a time during which the selected word line WLsel reaches a desired voltage by applying the kick voltage.

However, when the kick voltage is applied to a word line WL driven from both sides, since the voltage increases faster than that in the word line WL driven from one side, the voltage of the word line WL may increase excessively. As a result, for example, when the voltage of the word line WL which has increased by applying the kick voltage drops to a desired read voltage, the voltage of the bit line BL changes due to the coupling of the word line and the channel. In the read operation, the control signal STB needs to be asserted while the voltage of the bit line BL is stabilized. Therefore, when a noise occurs on the bit line BL due to the application of the kick voltage, it is required to set a standing time for the voltage of the bit line BL to be stabilized.

Therefore, in the semiconductor memory device 10 according to the fifth exemplary embodiment, the kick voltage in the read operation in which the word line WL driven from both sides is selected is set to be lower than the kick voltage in the read operation in which the word line WL driven from one side is selected. Specifically, for example, when the “A” level is read, the kick voltage AR+ΔAR2 when selecting the word line WL driven from both sides is set to be lower than the kick voltage AR+ΔAR1 when selecting the word line driven from one side.

As a result, in the semiconductor memory device 10 according to the fifth exemplary embodiment, the noise occurring in the bit line BL may be prevented by applying the kick voltage in the read operation in which the word line WL driven from both sides is selected. Therefore, the semiconductor memory device 10 according to the fifth exemplary embodiment may accelerate the read operation since the time for which the voltage of the bit line BL is stabilized during the read operation may be shortened.

Further, in the foregoing description, a case where the kick voltage smaller than that in the first read operation is used in the second read operation has been described as an example, but the present disclosure is not limited thereto. For example, the kick voltage may be applied in the first read operation, and the kick voltage may not be applied in the second read operation. Even in this case, the semiconductor memory device 10 may obtain the same effect as in the fifth exemplary embodiment described above.

[6] Sixth Exemplary Embodiment

Next, the semiconductor memory device 10 according to a sixth exemplary embodiment will be described. The semiconductor memory device 10 according to the sixth exemplary embodiment is a modification of the semiconductor memory device 10 according to the fifth exemplary embodiment, and the operations relating to the read pass voltage Vread are different in the first and second read operations.

[6-1] Operation

Figure 23:
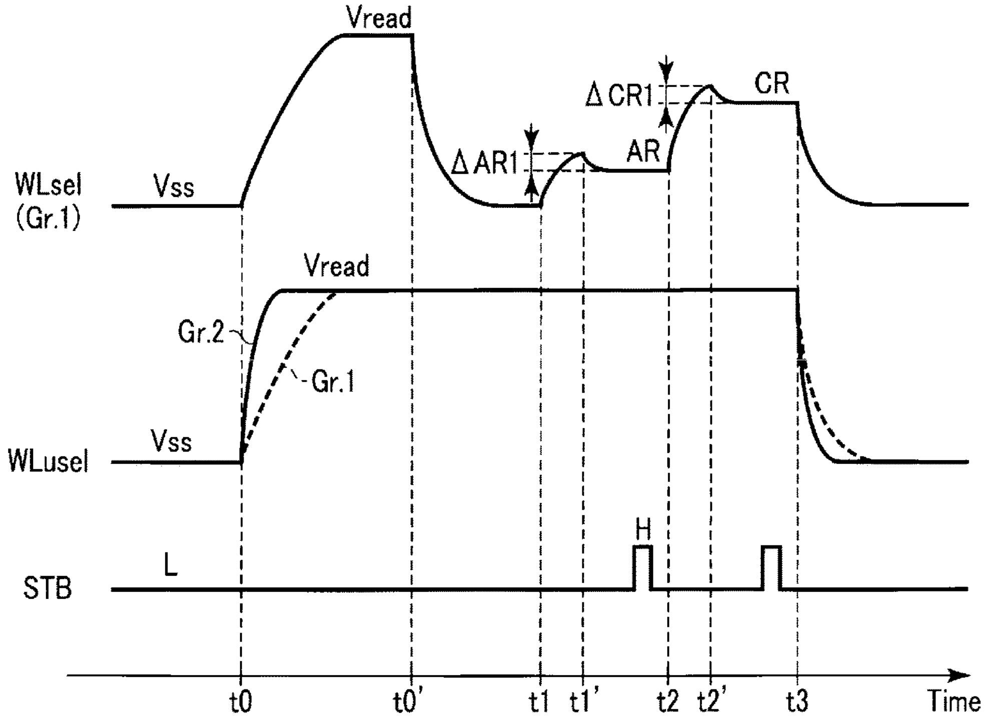
FIG. 23 is a timing chart of a first read operation in the semiconductor memory device according to a sixth exemplary embodiment.
Figure 24:
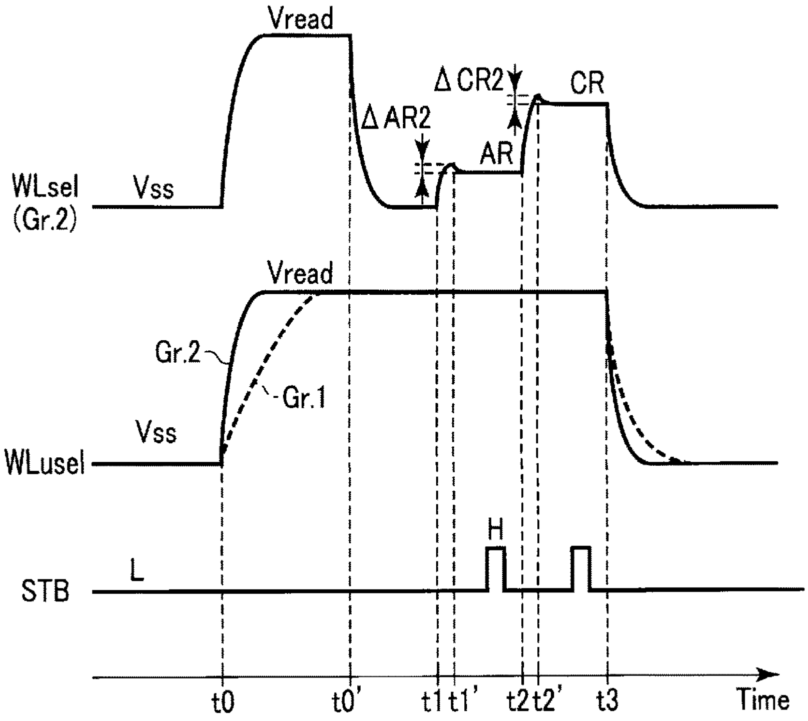
FIG. 24 is a timing chart of a second read operation in the semiconductor memory device according to the sixth exemplary embodiment.

Hereinafter, the read operation of the semiconductor memory device 10 according to the sixth exemplary embodiment will be described with reference to FIGS. 23 and 24. FIGS. 23 and 24 are timing charts of the first and second read operations in the sixth exemplary embodiment, respectively, and illustrate the waveforms of word lines WL and a control signal STB. The operations at time t0 to time t3 illustrated in FIGS. 23 and 24 respectively correspond to the operations at time t0 to time t3 described with reference to FIGS. 11 and 12.

As illustrated in FIGS. 23 and 24, the first and second read operations according to the sixth exemplary embodiment are different, in the timing at which the read pass voltage Vread is applied, from the first and second read operations in the fifth exemplary embodiment which have been described with reference to FIGS. 21 and 22, respectively.

Specifically, in the first read operation, the row decoder module 13A applies the read pass voltage Vread to the selected word line WLsel (Gr. 1) at time t0 and lowers the voltage to a ground voltage Vss at the subsequent time t0', as illustrated in FIG. 23. The subsequent operation is the same as the first read operation described with reference to FIG. 21.

Likewise, in the second read operation, the row decoder modules 13A and 13B apply the read pass voltage Vread to the selected word line WLsel (Gr. 2) at time t0 and lower the voltage to the ground voltage Vss at the subsequent time t0', as illustrated in FIG. 24. The subsequent operation is the same as the second read operation described with reference to FIG. 22.

The period at time t0' in the first and second read operations described above is set, for example, to be shorter in the second read operation side than in the first read operation. The description of the other operations is omitted since the operations are the same as the first and second read operations described in the first exemplary embodiment with reference to FIGS. 11 and 12.

[6-2] Effect of Sixth Exemplary Embodiment

In the first and second read operations in the sixth exemplary embodiment described above, the read pass voltage Vread is applied in the same manner as the non-selected word line WLusel before various read voltages are applied to the selected word line WLsel.

The semiconductor memory device 10 may reduce the kick voltage in the second read operation to be smaller than the kick voltage in the first read operation as described in the fifth exemplary embodiment in the read operation, thereby obtaining the same effect as in the fifth exemplary embodiment. Therefore, the semiconductor memory device 10 according to the sixth exemplary embodiment may accelerate the read operation in the same manner as in the fifth exemplary embodiment.

Figure 25:
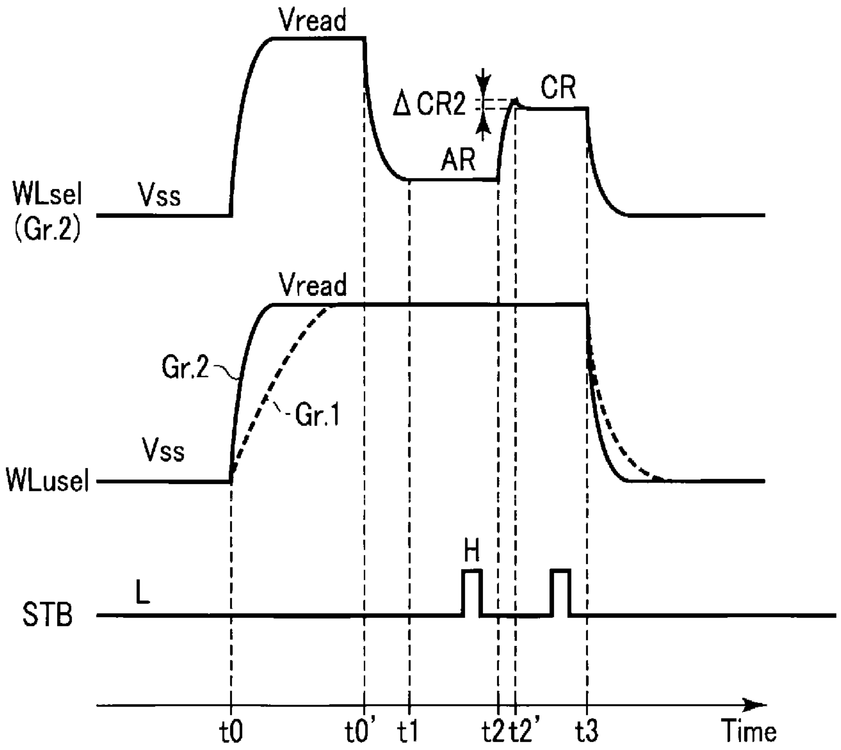
FIG. 25 is a timing chart of a second read operation in the semiconductor memory device according to a modification of the sixth exemplary embodiment.

Further, as a modification of the second read operation in the sixth exemplary embodiment described above, the modification illustrated in FIG. 25 is considered. FIG. 25 illustrates a timing chart of the second read operation in the modification of the sixth exemplary embodiment. As illustrated in FIG. 25, the second read operation in the modification is different from the second read operation described with reference to FIG. 24 in the operation at time t0'.

Specifically, at time t0', the row decoder modules 13A and 13B are lowered from the read pass voltage Vread directly to the read voltage AR as illustrated in FIG. 24. That is, the applying of the kick voltage is omitted at the time of reading the "A" level. Even in this case, the semiconductor memory device 10 may obtain the same effect as in the sixth exemplary embodiment described above.

[7] Seventh Exemplary Embodiment

Next, the semiconductor memory device 10 according to a seventh exemplary embodiment will be described. The semiconductor memory device 10 according to the seventh exemplary embodiment uses a word line WL of both-side driving group in the first to sixth exemplary embodiments as a word line of one-side driving group in accordance with the operation.

[7-1] Configuration

Figure 26:
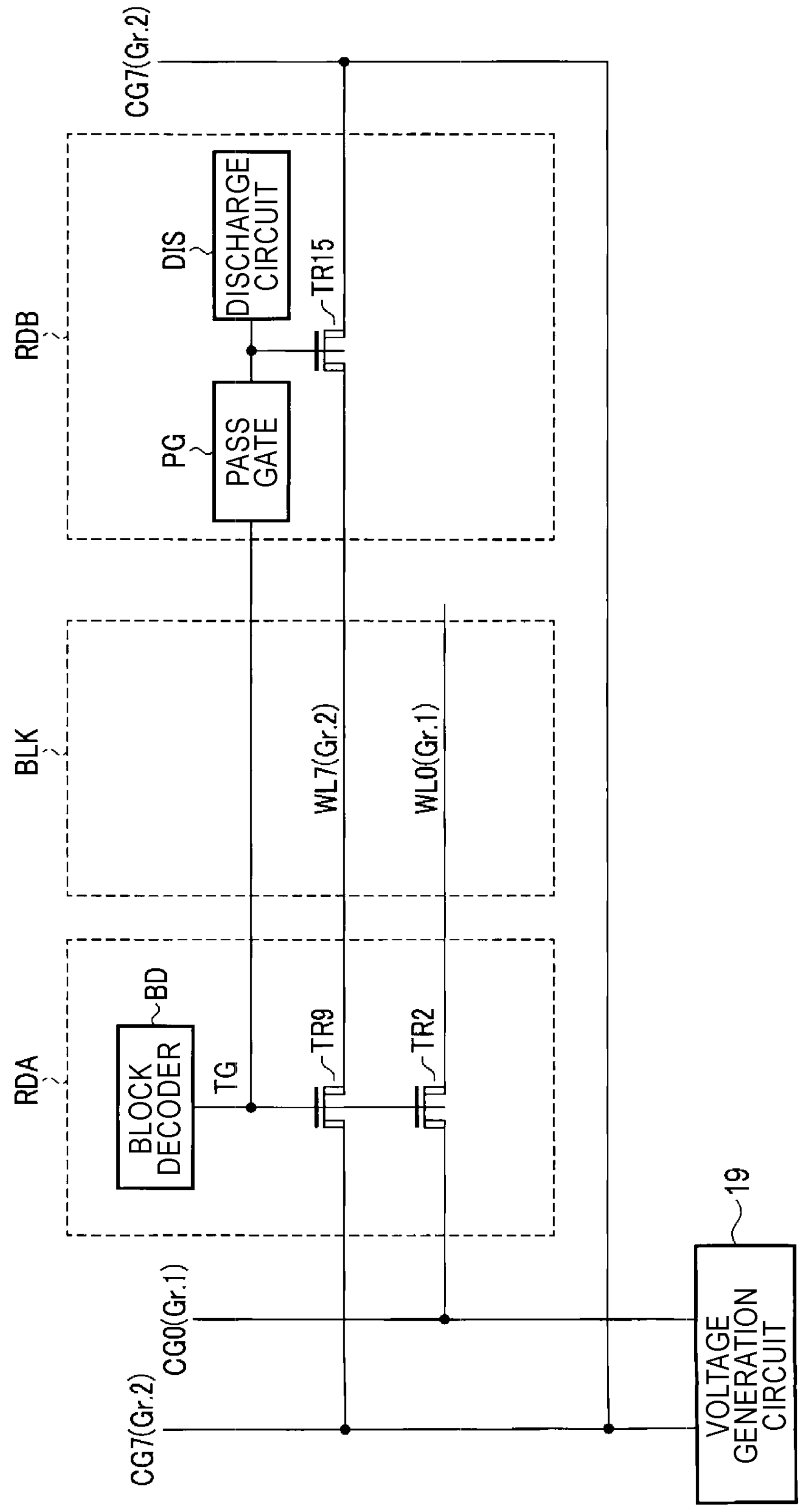
FIG. 26 is a circuit diagram of a row decoder module provided in the semiconductor memory device according to a seventh exemplary embodiment.

Hereinafter, with reference to FIG. 26, the configuration of the semiconductor memory device 10 according to the seventh exemplary embodiment will be described focusing on features different from those of the first exemplary embodiment. FIG. 26 is a circuit diagram of the row decoder module 13 according to the seventh exemplary embodiment and illustrates a set of row decoders RDA and RDB and the elements extracted relating to the word line WL0 of the first group (one-side driving group) and the word line WL7 of the second group (both-side driving group). As illustrated in FIG. 26, the row decoder RDB in the seventh exemplary embodiment further includes a pass gate PG and a discharge circuit DIS.

The pass gate PG is connected between a transfer gate line TG of a corresponding block decoder BD and the gate of a transistor TR connected to a signal line CG within the row decoder RDB. Further, the pass gate PG may form or block a current path between the transfer gate line TG and the gate of the transistor TR connected to the signal line CG within the row decoder RDB based on the control of the sequencer 17.

The discharge circuit DIS is connected to the gate of the transistor TR connected to the signal line CG within the row decoder RDB. Further, the discharge circuit DIS grounds the gate of the transistor TR based on the control of the sequencer 17. For example, when the word line WL which can be driven from both sides is driven from one side, the discharge circuit DIS grounds the gate of the transistor TR.

Figure 27:
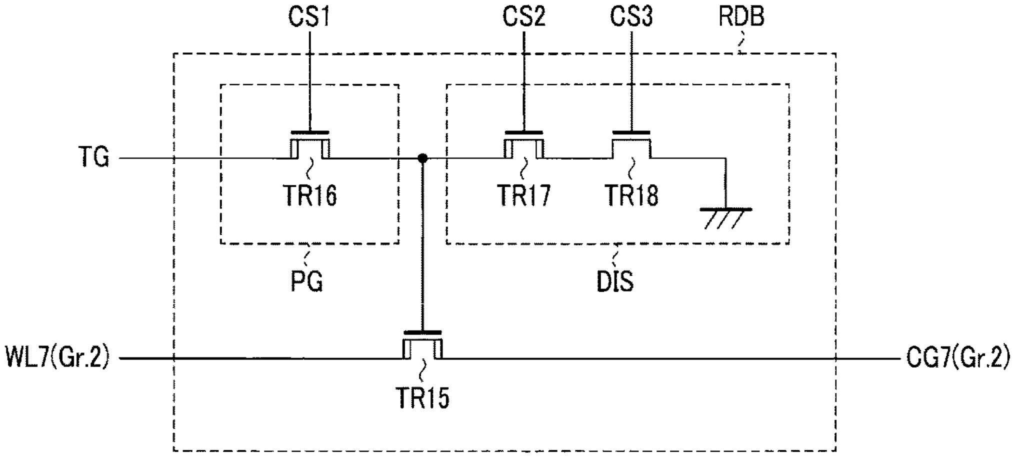
FIG. 27 is a more detailed circuit diagram of the row decoder module of FIG. 26.

An example of the detailed circuit configuration of the row decoder RDB including the pass gate PG and the discharge circuit DIS is illustrated in FIG. 27. FIG. 27 is a detailed circuit diagram of the row decoder RDB and illustrates the components extracted relating to the word line WL7. As illustrated in FIG. 27, the pass gate PG includes a high breakdown voltage n-channel transistor TR16, and the discharge circuit DIS includes a high breakdown voltage n-channel transistor TR17 and a low breakdown voltage n-channel transistor TR18.

One end of the transistor TR16 is connected to the corresponding transfer gate line TG and the other end thereof is connected to the gate of the transistor TR15. One end of the transistor TR17 is connected to the gate of the transistor TR15 and the other end thereof is connected to one end of the transistor TR18. The other end of the transistor TR18 is connected to the ground line. Further, control signals CS1, CS2, and CS3 are input to the gates of the transistors TR16, TR17, and TR18, respectively. The control signals CS1, CS2, and CS3 are, for example, signals generated by the sequencer 17.

[7-2] Effect of Seventh Exemplary Embodiment

As described above, in the semiconductor memory device 10 according to the sixth exemplary embodiment, the row decoders RDB include the pass gate PG and the discharge circuit DIS, respectively. Further, the sequencer 17 controls the pass gate PG and the discharge circuit DIS in accordance with various operations.

Specifically, when a word line WL corresponding to both-side driving is used for both-side driving, the sequencer 17 turns on the transistor TR16 in the pass gate PG to turn off the transistors TR17 and TR18 in the discharge circuit DIS. Then, the voltage of the transfer gate TG is input to, for example, the gates of the transistors TR14 and TR15 via the pass gate PG. As a result, the corresponding word line WL may be driven from both sides when the corresponding block BLK is selected.

Meanwhile, when the word line WL corresponding to both-side driving is used for one-side driving, the sequencer 17 turns off the transistor TR16 in the pass gate PG to turn on the transistors TR17 and TR18 in the discharge circuit DIS. Then, the pass gate PG blocks a current path between the transfer gate TG and the transistor TR, and the discharge circuit DIS lowers, for example, the gate voltages of the transistors TR14 and TR15 to the ground voltage Vss. As a result, for example, the transistors TR17 and TR18 are turned off, and the voltage via the row decoder module 13B is not supplied to the word line WL corresponding to both-side driving. That is, the word line WL corresponding to both-side driving is driven from one side by the row decoder module 13A.

As described above, in the semiconductor memory device 10 according to the seventh exemplary embodiment, a word line WL corresponding to both-side driving may be used for one-side driving based on the control of the sequencer 17. Thus, in the semiconductor memory device 10, the both-side driving may be applied to the operation that obtains a large effect from the both-side driving and the one-side driving may be applied to the operation that obtains a small effect from the both-side driving. As a method of using a method of driving the word line WL, for example, it is considered that the both-side driving is applied to the read operation and the one-side driving is applied to the write operation.

Further, in the foregoing description, a case where the pass gate PG and the discharge circuit DIS have the circuit configuration illustrated in FIG. 27 has been described as an example, but the present disclosure is not limited thereto. For example, in the circuit configuration of the discharge circuit DIS illustrated in FIG. 27, the transistor TR18 may not be provided. In this case, the other end of the transistor TR17 is directly connected to the ground line.

Further, in the foregoing description, a case where the row decoder RDB includes a pass gate PG and a discharge circuit DIS has been described as an example, but the present disclosure is not limited thereto. For example, the pass gate PG and the discharge circuit DIS may be provided in the row decoder RDA, and may be provided in one of the row decoders RDA and RDB.

[8] Modifications

The semiconductor memory device 10 in the exemplary embodiments includes first and second memory cells <MT0, MT7, FIG. 6> that are each capable of storing n-bit data (n is an integer of 1 or more), first and second word lines <WL0, WL7, FIG. 6> that are connected to the first and second memory cells, respectively, a first transistor <RDA: TR2, FIG. 6>, one end of which is connected to one end of the first word line, and second and third transistors <RDA: TR9, RDB:TR15, FIG. 6>, one ends of which are connected to one end and the other end of the second word line, respectively. In the read operation of first bit data <upper bit, FIG. 3>, when the first word line is selected <FIG. 11>, a first voltage Vread is applied to the second word line for a first time <t0-t3, FIG. 11>, and when the second word line is selected <FIG. 12>, the first voltage is applied to the first word line for a second time <t0-t3, FIG. 12> which is shorter than the first time.

As a result, the semiconductor memory device capable of operating at high speed may be provided.

Figure 28:
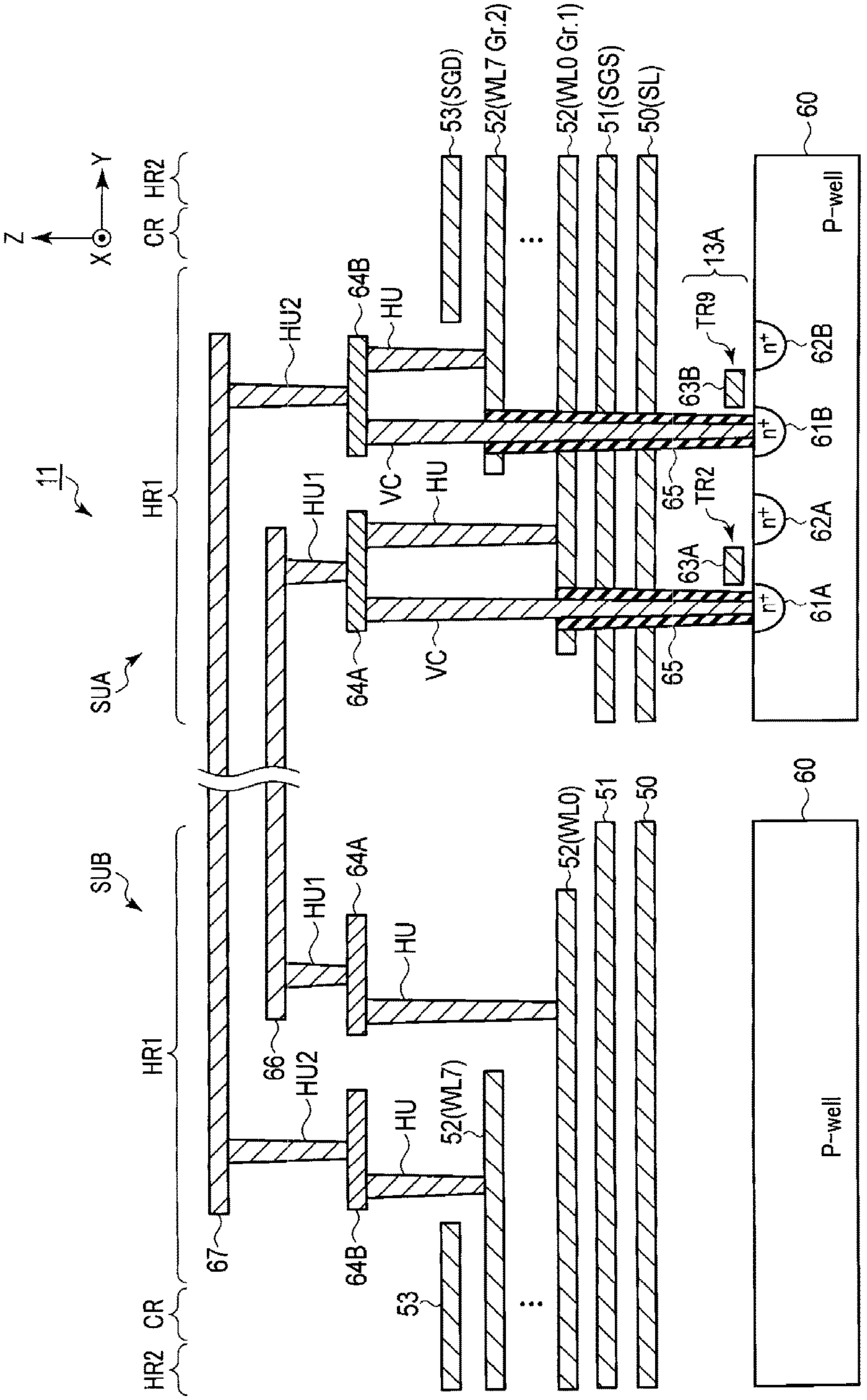
FIG. 28 is a cross-sectional view of the memory cell array and the row decoder module provided in the semiconductor memory device according to modifications of the first to seventh exemplary embodiments.

Further, as the structure of the semiconductor memory device 10 described in the above exemplary embodiments, for example, the structure illustrated in FIG. 28 may be adopted. FIG. 28 illustrates the cross-sectional view of the memory cell array 11 and the row decoder module 13 provided in the semiconductor memory device 10 according to a modification to the first to seventh exemplary embodiments and a cross-sectional structures in the regions HR1 of the string units SUA and SUB. Further, FIG. 28 omits the detailed structures of the regions CR and HR2. In addition, in FIG. 28, the string units SUA and SUB are schematically illustrated to be adjacent to each other.

As illustrated in FIG. 28, the string unit SUA has the same cross-sectional structure as the cross-sectional structure in the region HR1 of the string unit SU described above with reference to FIG. 10. Meanwhile, the string unit SUB has a structure that is the same as the structure described with reference to FIG. 10, in which the cross-sectional structure in the region HR1 is reversed and the configuration corresponding to the row decoder module 13A is omitted. Specifically, in the region HR1 of the string unit SUB, the diffusion regions 61 and 62, the conductor 63, and the via contact VC, and the insulating film 65 are omitted compared to the string unit SUA. Further, a via contact HU1 is provided on each of the conductors 64A of the string units SUA and SUB, and a conductor 66 is provided on each via contact HU1. Likewise, a via contact HU2 is provided on each of the conductors 64B of the string units SUA and SUB, and a conductor 67 is provided on each via contact HU2. Further, the layers in which the conductors 66 and 67 are provided may be the same as or different from each other. In addition, the configuration of the semiconductor memory device 10 described with reference to FIG. 28 is not limited thereto, and corresponding word lines WL may be electrically connected to each other between the string units SUA and SUB.

As described above, in the semiconductor memory device 10 according to the modification to the first to seventh exemplary embodiments, the row decoder module 13A is shared between the string units SU. In this way, even when the row decoder module 13A is shared between the string units SU, the configurations and operations described in the first to seventh exemplary embodiments may be applied to obtain the same effects.

Further, in the above-described exemplary embodiment, the transistors TR corresponding to the word lines WL and the transistors TR corresponding to the select gate lines SGD and SGS may have different structures. For example, the length of the gates of the transistors TR corresponding to the select gate lines SGD and the length of the gates of the transistors TR corresponding to the word lines WL may be different from each other. In this way, the row decoder module 13 provided in the semiconductor memory device 10 may be designed so that the breakdown voltages of the transistors TR are different for respective corresponding wirings.

Further, in the above-described exemplary embodiments, the row decoder module 13A is connected to word lines WL for one-side driving and both-side driving, and the row decoder module 13B is connected to a word line WL for both-side driving. That is, in the regions HR1 and HR2 illustrated in FIG. 10, the number of via contacts VC that pass through the conductor to be connected to the diffusion regions 61 on the semiconductor substrate becomes smaller in the region HR2 than in the region HR1.

Further, in the above-described first to sixth exemplary embodiments, the allocation of the transistors TR in the row decoders RDA and RDB is not limited thereto. For example, the transistors TR corresponding to word lines WL of both-side driving may be provided for the row decoders RDA and RDB, respectively, and the transistor TR corresponding to word lines WL of one-side driving may be provided in any one of the row decoders RDA and RDB.

In addition, in the above exemplary embodiment, a case where the row decoder module 13 is provided under the memory cell array 11 has been described as an example, but the present disclosure is not limited thereto. For example, the memory cell array 11 may be formed on the semiconductor substrate and the row decoder modules 13A and 13B may be disposed so as to sandwich the memory cell array 11 therebetween. Even in this case, the operations described in the above exemplary embodiments may be performed.

Further, in the above exemplary embodiment, a case where the semiconductor memory device 10 reads data for each page has been described as an example, but the present disclosure is not limited thereto. For example, the semiconductor memory device 10 may simultaneously read a plurality of bits of data stored in the memory cells.

In addition, in the above exemplary embodiments, operation timings in various operations are determined based on, for example, a clock CLK. For example, in the above exemplary embodiments, various operations in the case where word lines WL of both-side driving are selected are accelerated by speeding up the timing of a clock CLK that executes an operation at each timing.

Further, in the first, fifth, and sixth exemplary embodiments, each of read operations and write operations has been described with reference to a timing chart that represents the waveforms of word lines WL, but the waveforms of the signal lines CG are the same as the waveforms of the corresponding word lines WL. Specifically, in each of the read operations and write operations described in the first, fifth, and sixth exemplary embodiments, it is assumed that the same voltage is applied to, for example, the signal lines CG corresponding to the non-selected word lines WLusel driven from one side and the signal lines CG corresponding to the non-selected word lines WLusel driven from both sides. Further, in each of the read operations and write operations described in the first, fifth, and sixth exemplary embodiments, when the same voltage is applied to the signal lines CG corresponding to the word lines WL of one-side driving and the word lines WL of both-side driving, the waveforms of the signal lines CG become close to the waveforms of the word line WL of both-side driving in which the RC delay is relatively small. Thus, in the first, fifth, and sixth exemplary embodiments, the voltage applied to the word lines WL and the period during which the voltage is applied to the word lines WL may be roughly determined by checking the voltage of the corresponding signal lines CG.

Further, in the above exemplary embodiments, a case where no voltage drop due to a transistor TR occurs when a voltage is supplied from a signal line CG to a word line WL via the transistor TR has been described as an example, but the present disclosure is not limited thereto. For example, when a voltage is supplied from a signal line CG to a word line WL via a transistor TR, a voltage drop due to the transistor TR may occur. In this case, the voltage applied to the signal line CG becomes higher than the voltage applied to the corresponding word line WL.

Further, in the write operation described in the above exemplary embodiments, a case where two bits of data are stored for one memory cell has been described as an example, but the present disclosure is not limited thereto. For example, one bit or three or more bits of data may be stored for one memory cell. Even in this case, various operations described in the first to seventh exemplary embodiments may be applied.

Further, in the above exemplary embodiment, a case where a MONOS film is used in a memory cell has been described as an example, but the present disclosure is not limited thereto. For example, even when a memory cell using a floating gate is used, the same effect may be obtained by performing the read operations and the write operations described in the above exemplary embodiment.

In addition, in the above exemplary embodiments, the configuration of the memory cell array 11 may take other configurations. That is, the other configurations of the memory cell array 11 are described in, for example, U.S. patent application Ser. No. 12/407,403 entitled “Three-dimensional Stacked Nonvolatile Semiconductor Memory” and filed on Mar. 19, 2009, and further described in U.S. patent application Ser. No. 12/406,524 entitled “Three-dimensional Stacked Nonvolatile Semiconductor Memory” and filed on Mar. 18, 2009, U.S. patent application Ser. No. 12/679,991 entitled “Non-volatile Semiconductor Storage Device and Method of Manufacturing the Same” and filed on Mar. 25, 2010, and U.S. patent application Ser. No. 12/532,030 entitled “Semiconductor Memory and Method for Manufacturing Same” and filed on Mar. 23, 2009. These patent applications are incorporated herein in their entireties by reference.

Further, in the above exemplary embodiments, a case where the block BLK is an erase unit of data has described as an example, but the present disclosure is not limited thereto. The other erase operations are described in U.S. patent application Ser. No. 13/235,389 entitled “Non-volatile Semiconductor Storage Device” and filed on Sep. 18, 2011 and U.S. patent application Ser. No. 12/694,690 entitled “Non-volatile Semiconductor Storage Device” and filed on Jan. 27, 2010. These patent applications are incorporated herein in their entireties by reference.

Further, in the present specification, the term “connect” means that elements are electrically connected to each other and does not exclude, for example, a case in which another element is interposed between the elements. Also, in the present specification, the term “block” means that a corresponding switch is turned off and does not exclude, for example, a case in which a minute current such as a leakage current of a transistor flows.

In addition, in each of the above described exemplary embodiments, (1) in the read operation, a voltage applied to a word line selected in the read operation of the “A” level is, for example, between 0 and 0.55 V. Without being limited thereto, the voltage may be between 0.1 and 0.24 V, between 0.21 and 0.31 V, between 0.31 and 0.4 V, between 0.4 and 0.5 V, or between 0.5 and 0.55 V.

The voltage applied to a word line selected in the read operation of the “B” level is, for example, between 1.5 and 2.3 V. Without being limited thereto, the voltage may be between 1.65 and 1.8 V, between 1.8 and 1.95 V, between 1.95 and 2.1 V, or between 2.1 and 2.3 V.

The voltage applied to a word line selected in the read operation of the “C” level is, for example, between 3.0 and 4.0 V. Without being limited thereto, the voltage may be between 3.0 and 3.2 V, between 3.2 and 3.4 V, between 3.4 and 3.5 V, between 3.5 and 3.6 V, or between 3.6 and 4.0 V.

The time for the read operation, tRead, may be, for example, between 25 and 38 μs, between 38 and 70 μs, or between 70 and 80 μs.

(2) The write operation includes the program operation and the verifying operation described above. The voltage initially applied to a word line selected during the program operation is, for example, between 13.7 and 14.3 V. Without being limited thereto, the voltage may be, for example, between 13.7 and 14.0 V or between 14.0 and 14.6 V. The voltage applied to a non-selected word line during the program operation may be, for example, between 6.0 and 7.3 V. Without being limited thereto, the voltage may be, for example, between 7.3 and 8.4 V or may be 6.0 V or less.

In the write operation, the voltage initially applied to a selected word line when an odd-numbered word line is selected may be different from the voltage initially applied to a selected word line when an even-numbered word line is selected. In the write operation, the applied pass voltage may be changed depending on whether the non-selected word line is an odd-numbered word line or an even-numbered word line. The step-up width of the program voltage when the program operation is performed by an incremental step pulse program (ISPP) method is, for example, about 0.5 V. The time for the write operation, tProg, may be, for example, between 1700 and 1800 μs, between 1800 and 1900 μs, or between 1900 and 2000 μs.

(3) In the erase operation, the voltage initially applied to a well formed in the upper portion of the semiconductor substrate and disposed above the memory cell is, for example, between 12.0 and 13.6 V. Without being limited thereto, the voltage may be, for example, between 13.6 and 14.8 V, between 14.8 and 19.0 V, between 19.0 and 19.8 V, or between 19.8 and 21.0 V.

The time for the erase operation, tErase, may be, for example, between 3000 and 4000 μs, between 4000 and 5000 μs, or between 4000 and 9000 μs.

(4) A memory cell structure has a charge storage layer disposed on a semiconductor substrate (silicon substrate) via a tunnel insulating film having a thickness of 4 to 10 nm. The charge storage layer may have a stacked structure of an insulating film such as, for example, SiN or SiON having a film thickness of 2 to 3 nm and a polysilicon film having a film thickness of 3 to 8 nm. Further, a metal such as Ru may be added to the polysilicon. The memory cell structure has an insulating film on the charge storage layer. The insulating film has a silicon oxide film having a thickness of 4 to 10 nm and sandwiched between a lower high-k film having a film thickness of 3 to 10 nm and an upper high-k film having a film thickness of 3 to 10 nm. As the high-k film, HfO or the like may be mentioned. Further, the film thickness of the silicon oxide film may be thicker than the film thickness of the high-k film. On the insulating film, a control electrode having a film thickness of 30 to 70 nm is formed via a material having a film thickness of 3 to 10 nm. Here, the material is, a metal oxide film such as TaO or a metal nitride film such as TaN. As for the control electrode, W or the like may be used. Further, an air gap may be formed between memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:

first and second memory cells;

first and second word lines that are connected to the first and second memory cells, respectively;

a first transistor that is connected to one end of the first word line;

a second transistor that is connected to a first end of the second word line; and a third transistor that is connected to a second end of the second word line, wherein, during a read operation performed on the first and second memory cells, when the first word line is selected, a first voltage is applied to the second word line by turning on the second and third transistors, and then a second voltage is applied to the first word line by turning on the first transistor, and when the second word line is selected, the first voltage is applied to the first word line by turning on the first transistor, and then the second voltage is applied to the second word line by turning on the second and third transistors, and wherein the first transistor is turned on for a first time period to apply the second voltage to the first word line when the first word line is selected, and the second and third transistors are turned on for a second time period, which is shorter than the first time period, to apply the second voltage to the second word line when the second word line is selected.

2. The semiconductor memory device according to claim 1, further comprising:

a sense amplifier connected to the first and second memory cells, wherein, during the read operation, a timing at which the sense amplifier senses data in the first memory cell after the first transistor is turned on to apply the second voltage to the first word line when the first word line is selected, is later than a timing at which the sense amplifier senses data in the second memory cell after the second and third transistors are turned on to apply the second voltage to the second word line when the second word line is selected.

3. The semiconductor memory device according to claim 1, further comprising:

a first signal line that is connected to the first word line through the first transistor; and a second signal line that is connected to the second word line through the second and third transistors, wherein, during the read operation, a third voltage is applied to the first signal line and the first transistor turned on when applying the first voltage to the first word line and a fourth voltage is applied to the first signal line and the first transistor turned on when applying the second voltage to the first word line, and the third voltage is applied to the second signal line and the second and third transistors turned on when applying the first voltage to the second word line and the fourth voltage is applied to the second signal line and the second and third transistors turned on when applying the second voltage to the second word line.

4. The semiconductor memory device according to claim 3, wherein during the read operation, a rate of increasing a voltage of the second signal line to reach the third voltage when the first word line is selected is lower than a rate of increasing a voltage of the first signal line to reach the third voltage when the second word line is selected.

5. The semiconductor memory device according to claim 4, further comprising:

a first driver configured to supply the voltage to the first signal line;

a second driver configured to supply the voltage to the second signal line; and a resistance element connected between the second signal line and the second driver.

6. The semiconductor memory device according to claim 3, wherein during the read operation, a time period between applying the third voltage to the second signal line and applying the fourth voltage to the first signal line, when the first word line is selected, is shorter than a time period between applying the third voltage to the first signal line and applying the fourth voltage to the second signal line, when the second word line is selected.

7. The semiconductor memory device according to claim 1, wherein the first voltage is higher than the second voltage.

8. A semiconductor memory device comprising:

first and second memory cells;

first and second word lines that are connected to the first and second memory cells, respectively;

a first transistor that is connected to one end of the first word line;

a second transistor that is connected to a first end of the second word line; and a third transistor that is connected to a second end of the second word line, wherein, during a read operation performed on the first and second memory cells, when the first word line is selected, a first voltage is applied to the second word line by turning on the second and third transistors, and then a first voltage spike and a second voltage are applied to the first word line by turning on the first transistor, and when the second word line is selected, the first voltage is applied to the first word line by turning on the first transistor, and then a second voltage spike, which is smaller in magnitude than the first voltage spike, and the second voltage are applied to the second word line by turning on the second and third transistors.

9. The semiconductor memory device according to claim 8, wherein the first transistor is turned on for a first time period to apply the second voltage to the first word line when the first word line is selected, and the second and third transistors are turned on for a second time period, which is shorter than the first time period, to apply the second voltage to the second word line when the second word line is selected.

10. The semiconductor memory device according to claim 8, further comprising:

a sense amplifier connected to the first and second memory cells, wherein, during the read operation, a timing at which the sense amplifier senses data in the first memory cell after the first transistor is turned on to apply the second voltage to the first word line when the first word line is selected, is later than a timing at which the sense amplifier senses data in the second memory cell after the second and third transistors are turned on to apply the second voltage to the second word line when the second word line is selected.

11. The semiconductor memory device according to claim 8, further comprising:

a first signal line that is connected to the first word line through the first transistor; and a second signal line that is connected to the second word line through the second and third transistors, wherein, during the read operation, a third voltage is applied to the first signal line and the first transistor turned on when applying the first voltage to the first word line and a fourth voltage is applied to the first signal line and the first transistor turned on when applying the second voltage to the first word line, and the third voltage is applied to the second signal line and the second and third transistors turned on when applying the first voltage to the second word line and the fourth voltage is applied to the second signal line and the second and third transistors turned on when applying the second voltage to the second word line.

12. The semiconductor memory device according to claim 11, wherein during the read operation, a rate of increasing a voltage of the second signal line to reach the third voltage when the first word line is selected is lower than a rate of increasing a voltage of the first signal line to reach the third voltage when the second word line is selected.

13. The semiconductor memory device according to claim 12, further comprising:

a first driver configured to supply the voltage to the first signal line;

a second driver configured to supply the voltage to the second signal line; and a resistance element connected between the second signal line and the second driver.

14. The semiconductor memory device according to claim 11, wherein during the read operation, a time period between applying the third voltage to the second signal line and applying the fourth voltage to the first signal line, when the first word line is selected, is shorter than a time period between applying the third voltage to the first signal line and applying the fourth voltage to the second signal line, when the second word line is selected.

15. A semiconductor memory device comprising:

a memory cell array that includes first and second conductors sequentially stacked above a semiconductor substrate, a first region including first ends of the first and second conductors, a second region including seconds ends of the first and second conductors, and a third region between the first region and the second region that includes a plurality of memory cells;

a first row decoder including first and second diffusion regions formed on the semiconductor substrate; and a second row decoder including a third diffusion region formed on the semiconductor substrate, wherein in the first region, the first end of the first conductor is connected to the first diffusion region via a first plug, and the first end of the second conductor is connected to the second diffusion region via a second plug, and in the second region, the second end of the second conductor is connected to the third diffusion region via a third plug.

16. The semiconductor memory device according to claim 15, wherein in the second region, the second end of the first conductor is not connected to a diffusion region formed on the semiconductor substrate.

17. The semiconductor memory device according to claim 16, further comprising:

fourth and fifth plugs on the first and second conductors in the first region, respectively;

a sixth plug on the second conductor in the second region;

a third conductor on the first and fourth plugs;

a fourth conductor on the second and fifth plugs; and a fifth conductor on the third and sixth plugs, wherein the first, second, and third plugs pass through the first conductor.

18. The semiconductor memory device according to claim 15, wherein the memory cell array includes a plurality of semiconductor pillars that pass through the first and second conductors in the third region to form a plurality of memory cells at intersections of the semiconductor pillars and the first and second conductors.

19. The semiconductor memory device according to claim 18, wherein a voltage from the first row decoder is applied to the first end of the first conductor during a read operation on one of the memory cells located at an intersection of one of the semiconductor pillars and the first conductor, and voltages from the first and second row decoders are respectively applied to the first and second ends of the second conductor during a read operation on one of the memory cells located at an intersection of one of the semiconductor pillars and the second conductor.

20. The semiconductor memory device according to claim 15, wherein the first row decoder further includes fourth and fifth diffusion regions formed on the semiconductor substrate and the second row decoder further includes sixth diffusion region formed on the semiconductor substrate, and the fourth, fifth, and sixth diffusion regions are connected to output lines of a voltage generation circuit.

* * * * *